United States Patent
Chang et al.

(10) Patent No.: US 6,168,974 B1
(45) Date of Patent: Jan. 2, 2001

(54) PROCESS OF MOUNTING SPRING CONTACTS TO SEMICONDUCTOR DEVICES

(75) Inventors: Sung Chul Chang, Riverbank; Igor Y. Khandros, Orinda; William D. Smith, Pleasanton, all of CA (US)

(73) Assignee: FormFactor, Inc., Livermore, CA (US)

( * ) Notice: Under 35 U.S.C. 154(b), the term of this patent shall be extended for 0 days.

(21) Appl. No.: 09/499,963

(22) Filed: Feb. 8, 2000

Related U.S. Application Data

(63) Continuation of application No. 09/106,943, filed on Jun. 30, 1998, now Pat. No. 6,023,103, which is a continuation of application No. 08/602,179, filed on Feb. 15, 1996, now abandoned, which is a continuation-in-part of application No. 08/558,332, filed on Nov. 15, 1995, now Pat. No. 5,829,128, which is a continuation-in-part of application No. 08/452,255, filed on May 26, 1995, now abandoned, which is a continuation-in-part of application No. 08/340,144, filed on Nov. 15, 1994, now Pat. No. 5,917,707, which is a continuation-in-part of application No. PCT/US94/13373, filed on Nov. 16, 1994, which is a continuation-in-part of application No. 08/152,812, filed on Nov. 16, 1993, now Pat. No. 5,476,211.

(51) Int. Cl.[7] ............................. H01L 21/44; H01L 21/48; H01L 21/50

(52) U.S. Cl. ...................... 438/109; 438/110; 438/113; 438/117; 438/652

(58) Field of Search ..................................... 438/109, 110, 438/113, 117, 652, FOR 349, FOR 365, FOR 368

(56) References Cited

U.S. PATENT DOCUMENTS

| 4,751,199 | * | 6/1988 | Phy . |
| 5,239,447 | * | 8/1993 | Cotues et al. . |

* cited by examiner

*Primary Examiner*—David E. Graybill
(74) *Attorney, Agent, or Firm*—Gerald E. Linden; David Larwood

(57) ABSTRACT

A process for providing a plurality free-standing resilient contact structures (spring elements) mounted to a surface of a carrier substrate. The carrier substrate is mounted to a surface of a semiconductor device, or one or more unsingulated semiconductor dies. Bond pads of the semiconductor device are connected to the spring elements by bond wires extending between the bond pads and terminals associated with the spring elements. The carrier substrate is mounted to one or more semiconductor devices prior to the semiconductor devices being singulated from a semiconductor wafer upon which they are formed Resilience and compliance to effect pressure connections to the semiconductor device are provided by the spring elements extending from the carrier substrate, per se.

18 Claims, 8 Drawing Sheets

PROCESS OF MOUNTING SPRING CONTACTS TO SEMICONDUCTOR DEVICES

CROSS-REFERENCE TO RELATED APPLICATIONS

This patent application is a continuation of U.S. patent application Ser. No. 09/106,943, filed Jun. 30, 1998 (now U.S. Pat. No. 6,023,103, issued Feb. 8, 2000), which is a continuation of U.S. patent application Ser. No. 08/602,179, filed Feb. 15, 1996 (now abandoned), which is a continuation-in-part of commonly-owned, U.S. patent application Ser. No. 08/452,255 (hereinafter "PARENT CASE"), filed May 26, 1995 (now abandoned), which is a continuation-in-part of commonly-owned, U.S. patent application Ser. No. 08/340,144 filed Nov. 15, 1994 (now U.S. Pat. No. 5,917,707, issued Jun. 29, 1999) and its counterpart PCT patent application number PCT/US94/13373 filed Nov. 16, 1994 (published May 26, 1995 as WO 95/14314), both of which are continuations-in-part of commonly-owned, U.S. patent application Ser. No. 08/152,812, filed Nov. 16, 1993 (now U.S. Pat. No. 5,476,211, issued Dec. 19, 1995).

This patent application is also a continuation-in-part of commonly-owned, U.S. patent application Ser. No. 08/558,332, filed Nov. 15, 1995 (now U.S. Pat. No. 5,829,128, issued Nov. 3, 1998), which is a continuation-in-part of the aforementioned PARENT CASE.

TECHNICAL FIELD OF THE INVENTION

The invention relates to making temporary, pressure connections between electronic components and, more particularly, to techniques for mounting resilient contact structures (spring contacts) to semiconductor devices prior to their packaging, preferably prior to the individual semiconductor devices being singulated (separated) from a semiconductor wafer.

BACKGROUND OF THE INVENTION

Individual semiconductor (integrated circuit) devices (dies) are typically produced by creating several identical devices on a semiconductor wafer, using known techniques of photolithography, deposition, and the like. Generally, these processes are intended to create a plurality of fully-functional integrated circuit devices, prior to singulating (severing) the individual dies from the semiconductor wafer.

Generally, after singulating the semiconductor dies (devices) from the wafer, they are packaged (finally assembled). Various techniques are known for attaching semiconductor dies to other components, including: (a) wire bonding, (b) tape-automated bonding (TAB), and (c) flip-chip bonding.

It is generally desirable to be able to identify which of the plurality of dies on a wafer are good dies prior to their packaging, and preferably prior to their being singulated from the wafer. To this end, a wafer "tester" or "prober" may advantageously be employed to make a plurality of discrete pressure connections to a like plurality of discrete terminals (bond pads) on the dies, and provide signals (including power) to the dies. In this manner, the semiconductor dies can be exercised (tested and burned in), prior to singulating the dies from the wafer.

A conventional component of a wafer tester is a "probe card" to which a plurality of spring-like probe elements (e.g., titanium needles) are connected—tips of the probe elements effecting the pressure connections to the respective bond pads of the semiconductor dies. Certain difficulties are inherent in any such technique for probing semiconductor dies. For example, modern integrated circuits include many thousands of transistor elements requiring many hundreds of bond pads disposed in close proximity to one another (e.g., 5 mils center-to-center).

To effect reliable pressure connections to a semiconductor device, particularly for probing the device, one must be concerned with several parameters including, but not limited to: alignment, probe force, overdrive, contact force, balanced contact force, scrub, contact resistance, and planarization. A general discussion of these parameters may be found in U.S. Pat. No. 4,837,622, entitled HIGH DENSITY PROBE CARD, incorporated by reference herein.

Wafer testers may alternately employ a probe membrane having a central contact bump area, as is discussed in U.S. Pat. No. 5,422,574, entitled LARGE SCALE PROTRUSION MEMBRANE FOR SEMICONDUCTOR DEVICES UNDER TEST WITH VERY HIGH PIN COUNTS, incorporated by reference herein. As noted in this patent, "A test system typically comprises a test controller for executing and controlling a series of test programs, a wafer dispensing system for mechanically handling and positioning wafers in preparation for testing and a probe card for maintaining an accurate mechanical contact with the device-under-test (DUT)." (column 1, lines 41–46)

Generally, interconnections between electronic components can be classified into the two broad categories of "relatively permanent" and "readily demountable".

An example of a "relatively permanent" connection is a solder joint. Once two components are soldered to one another, a process of unsoldering must be used to separate the components. A wire bond is another example of a "relatively permanent" connection.

An example of a "readily demountable" connection is rigid pins of one electronic component being received by resilient socket elements of another electronic component. The socket elements exert a contact force (pressure) on the pins in an amount sufficient to ensure a reliable electrical connection therebetween.

Interconnection elements intended to make pressure contact with terminals of an electronic component are referred to herein as "springs" or "spring elements" or "spring contacts". Generally, a certain minimum contact force is desired to effect reliable pressure contact to electronic components (e.g., to terminals on electronic components). For example, a contact (load) force of approximately 15 grams (including as little as 2 grams or less and as much as 150 grams or more, per contact) may be desired to ensure that a reliable electrical connection is made to a terminal of an electronic component which may be contaminated with films on its surface, or which has corrosion or oxidation products on its surface. The minimum contact force required of each spring demands either that the yield strength of the spring material or that the size of the spring element are increased. As a general proposition, the higher the yield strength of a material, the more difficult it will be to work with (e.g., punch, bend, etc.). And the desire to make springs smaller essentially rules out making them larger in cross-section.

Probe elements are exemplary of a class of spring elements of particular relevance to the present invention. Prior art probe elements are commonly fabricated from titanium, a relatively hard (high yield strength) material. When it is desired to mount such relatively hard materials to terminals of an electronic component, relatively "hostile" (e.g., high temperature) processes such as brazing are required. Such "hostile" processes are generally not desirable (and often not feasible) in the context of certain relatively "fragile" electronic components such as semiconductor devices. In contrast thereto, wire bonding is an example of a relatively "friendly" processes which is much less potentially damaging to fragile electronic components than brazing. Soldering is another example of a relatively "friendly" process. However, both solder and gold are relatively soft (low yield strength) materials which will not function well as spring elements.

A subtle problem associated with interconnection elements, including spring contacts, is that, often, the terminals of an electronic component are not perfectly coplanar. Interconnection elements lacking in some mechanism incorporated therewith for accommodating these "tolerances" (gross non-planarities) will be hard pressed to make consistent contact pressure contact with the terminals of the electronic component.

The following U.S. patents, incorporated by reference herein, are cited as being of general interest vis-a-vis making connections, particularly pressure connections, to electronic components: U.S. Pat. Nos. 5,386,344 (FLEX CIRCUIT CARD ELASTOMERIC CABLE CONNECTOR ASSEMBLY); 5,336,380 (SPRING BIASED TAPERED CONTACT ELEMENTS FOR ELECTRICAL CONNECTORS AND INTEGRATED CIRCUIT PACKAGES); 5,317,479 (PLATED COMPLIANT LEAD); 5,086,337 (CONNECTING STRUCTURE OF ELECTRONIC PART AND ELECTRONIC DEVICE USING THE STRUCTURE); 5,067,007 (SEMICONDUCTOR DEVICE HAVING LEADS FOR MOUNTING TO A SURFACE OF A PRINTED CIRCUIT BOARD); 4,989,069 (SEMICONDUCTOR PACKAGE HAVING LEADS THAT BREAK-AWAY FROM SUPPORTS); 4,893,172 (CONNECTING STRUCTURE FOR ELECTRONIC PART AND METHOD OF MANUFACTURING THE SAME); 4,793,814 (ELECTRICAL CIRCUIT BOARD INTERCONNECT); 4,777,564 (LEADFORM FOR USE WITH SURFACE MOUNTED COMPONENTS); 4,764,848 (SURFACE MOUNTED ARRAY STRAIN RELIEF DEVICE); 4,667,219 (SEMICONDUCTOR CHIP INTERFACE); 4,642,889 (COMPLIANT INTERCONNECTION AND METHOD THEREFOR); 4,330,165 (PRESS-CONTACT TYPE INTERCONNECTORS); 4,295,700 (INTERCONNECTORS); 4,067,104 (METHOD OF FABRICATING AN ARRAY OF FLEXIBLE METALLIC INTERCONNECTS·FOR COUPLING MICROELECTRONICS COMPONENTS); 3,795,037 (ELECTRICAL CONNECTOR DEVICES); 3,616,532 (MULTILAYER PRINTED CIRCUIT ELECTRICAL INTERCONNECTION DEVICE); and 3,509,270 (INTERCONNECTION FOR PRINTED CIRCUITS AND METHOD OF MAKING SAME).

It would appear advantageous to provide the semiconductor device itself with a mechanism for effecting pressure contacts. A limited number of techniques are suggested in the prior art for providing semiconductor chip assemblies with terminals that are biased away from the surface of the semiconductor die (chip). U.S. Pat. No. 5,414,298, entitled SEMICONDUCTOR CHIP ASSEMBLIES AND COMPONENTS WITH PRESSURE CONTACT, discloses that such an assembly "can be extremely compact and may occupy an area only slightly larger than the area of the chip itself."

BRIEF DESCRIPTION (SUMMARY) OF THE INVENTION

It is an object of the present invention to provide a technique for mounting resilient contact structures (spring contacts) to semiconductor devices.

It is another object of the present invention to provide a technique for probing semiconductor dies, prior to their being singulated (separated) from a semiconductor wafer, with the requisite resiliency and/or compliance elements (i.e., spring elements) being resident on the semiconductor dies, rather than requiring the probe cards to be provided with resilient contact structures extending therefrom.

It is another object of the present invention to provide an improved spring contact element (resilient contact structure), a plurality of which can be mounted upon a semiconductor device.

It is another object of the invention to provide interconnection elements that are suitable for making pressure contacts to electronic components.

It is an object of the present invention to provide a technique for making both temporary and permanent connections to electronic components, such as semiconductor dies, using the same interconnection structure.

It is a further object of the present invention to provide a technique for making temporary interconnections to dies, for performing burn-in and or testing of the dies, either before the dies are singulated from the wafer, or after the dies are singulated from the wafer.

According to the invention, a plurality of resilient contact structures (spring elements) are mounted to a rigid carrier substrate, the carrier substrate is mounted to the semiconductor device, and the spring elements are connected, such as with bond wires to corresponding ones of the bond pads on the semiconductor device. The spring elements provide the desired resiliency, per se, without requiring other instrumentalities. The carrier substrate remains fixed with respect to the electronic component (e.g., semiconductor device) to which it is mounted—in other words, the carrier substrate is not resiliently mounted to the semiconductor device.

According to a feature of the present invention, resilient contact structures can be mounted to semiconductor dies, and the resilient contact structures can serve multiple purposes:

(a) the resilient contact structures can make reliable, temporary contact to test boards, which may be as simple and straightforward as ordinary printed circuit boards;

(b) the same resilient contact structures can make reliable pressure connections to circuit boards, when held in place by a spring clip, or the like; and (c) the same resilient contact structures can make reliable permanent connection to circuit boards, such as by soldering.

According to the invention, resilient contact structures can serve "double duty" both as temporary and as permanent connections to an electronic component, such as a semiconductor die.

Preferably, the spring contact elements are mounted to the semiconductor dies prior to the semiconductor dies being singulated (separated) from a semiconductor wafer. In this manner, a plurality of pressure contacts can be made to one or more unsingulated semiconductor dies (devices) using a "simple" test board to power-up the semiconductor devices, and the like.

As used herein, a "simple" test board is a substrate having a plurality of terminals, or electrodes, as contrasted with a traditional "probe card" which is a substrate having a plurality of probe elements extending from a surface thereof. A simple test board is less expensive, and more readily configured than a traditional probe card. Moreover, certain physical constraints inherent in traditional probe cards will not be encountered when using a simple test board to make the desired pressure contacts with the semiconductor device assemblies of the present invention.

In this manner, a plurality of unsingulated semiconductor dies can be exercised (tested and/or burned in) prior to the semiconductor dies being singulated (separated) from the wafer.

According to an aspect of the invention, the same spring contact elements which are mounted to the semiconductor dies and which are used to exercise the semiconductor dies can be used to make permanent or pressure connections to the semiconductor dies after they have been singulated from the wafer.

According to an aspect of the invention, the resilient contact structures are preferably formed as "composite interconnection elements" which are fabricated directly upon terminals of the carrier substrate. The "composite" (multilayer) interconnection element is fabricated by mounting an elongate element ("core", "wire stem") to a terminal of the carrier substrate, shaping the core to have a spring shape, and overcoating the core to enhance the physical (e.g., spring) characteristics of the resulting composite interconnection element and/or to securely anchor the resulting composite interconnection element to the carrier substrate.

The use of the term "composite", throughout the description set forth herein, is consistent with a 'generic' meaning of the term (e.g., formed of two or more elements), and is not to be confused with any usage of the term "composite" in other fields of endeavor, for example, as it may be applied to materials such as glass, carbon or other fibers supported in a matrix of resin or the like.

As used herein, the term "spring shape" refers to virtually any shape of an elongate element which will exhibit elastic (restorative) movement of an end (tip) of the elongate element with respect to a force applied to the tip. This includes elongate elements shaped to have one or more bends, as well as substantially straight elongate elements.

As used herein, the terms "contact area", "terminal", "pad", and the like refer to any conductive area on any electronic component to which an interconnection element is mounted or makes contact.

Typically, the core of the composite interconnection element (spring element) is shaped after an end of the core is mounted to a terminal on the carrier substrate.

Alternatively, the core is shaped prior to mounting to an electronic component.

Alternatively, the core is mounted to or is a part of a sacrificial substrate which is not an electronic component. The sacrificial substrate is removed after shaping, and either before or after overcoating. According to an aspect of the invention, tips having various topographies can be disposed at the contact ends of the interconnection elements. (See also FIGS. 11A–11F of the PARENT CASE.)

In an embodiment of the invention, the core is a "soft" material having a relatively low yield strength, and is overcoated with a "hard" material having a relatively high yield strength. For example, a soft material such as a gold wire is attached (e.g., by wire bonding) to a bond pad of a semiconductor device and is overcoated (e.g., by electrochemical plating) with a hard material such nickel and its alloys.

Vis-a-vis overcoating the core, single and multi-layer overcoatings, "rough" overcoatings having microprotrusions (see also FIGS. 5C and 5D of the PARENT CASE), and overcoatings extending the entire length of or only a portion of the length of the core, are described. In the latter case, the tip of the core may suitably be exposed for making contact to an electronic component (see also FIG. 5B of the PARENT CASE).

Generally, throughout the description set forth herein, the term "plating" is used as exemplary of a number of techniques for overcoating the core. It is within the scope of this invention that the core can be overcoated by any suitable technique including, but not limited to: various processes involving deposition of materials out of aqueous solutions; electrolytic plating; electroless plating; chemical vapor deposition (CVD); physical vapor deposition (PVD); processes causing the deposition of materials through induced disintegration of liquid or solid precursors; and the like, all of these techniques for depositing materials being generally well known.

Generally, for overcoating the core with a metallic material such as nickel, electrochemical processes are preferred, especially electroless plating.

In another embodiment of the invention, the core is an elongate element of a "hard" material, inherently suitable to functioning as a spring element, and is mounted at one end to a terminal of an electronic component. The core, and at least an adjacent area of the terminal, is overcoated with a material which will enhance anchoring the core to the terminal. In this manner, it is not necessary that the core be well-mounted to the terminal prior to overcoating, and processes which are less potentially damaging to the electronic component may be employed to "tack" the core in place for subsequent overcoating. These "friendly" processes include soldering, gluing, and piercing an end of the hard core into a soft portion of the terminal.

Preferably, the core is in the form of a wire. Alternatively, the core is a flat tab (conductive metallic ribbon), or an elongate ribbon of material.

Representative materials, both for the core and for the overcoatings, are disclosed.

In the main hereinafter, techniques involving beginning with a relatively soft (low yield strength) core, which is generally of very small dimension (e.g., 3.0 mil or less) are described. Soft materials, such as gold, which attach easily to semiconductor devices, generally lack sufficient resiliency to function as springs. (Such soft, metallic materials exhibit primarily plastic, rather than elastic deformation.) Other soft materials which may attach easily to semiconductor devices and possess appropriate resiliency are often electrically non-conductive, as in the case of most elastomeric materials. In either case, desired structural and electrical characteristics can be imparted to the resulting composite interconnection element by the overcoating applied over the core. The resulting composite interconnection element can be made very small, yet can exhibit appropriate contact forces. Moreover, a plurality of such composite interconnection elements can be arranged at a fine pitch (e.g., 10 mils), even though they have a length (e.g., 100 mils) which is much greater than the distance to a neighboring composite interconnection element (the distance between neighboring interconnection elements being termed "pitch").

The composite interconnection elements of the present invention exhibit superior electrical characteristics, including electrical conductivity, solderability and low contact resistance. In many cases, deflection of the interconnection element in response to applied contact forces results in a "wiping" contact, which helps ensure that a reliable contact is made.

An additional advantage of the present invention is that connections made with the interconnection elements of the present invention are readily demountable. Soldering, to effect the interconnection to a terminal of an electronic component is optional, but is generally not preferred at a system level.

According to an aspect of the invention, techniques are described for making interconnection elements having controlled impedance. These techniques generally involve coating (e.g., electrophoretically) a conductive core or an entire composite interconnection element with a dielectric material (insulating layer), and overcoating the dielectric material with an outer layer of a conductive material. By grounding the outer conductive material layer, the resulting interconnection element can effectively be shielded, and its impedance can readily be controlled. (See also FIG. 10K of the PARENT CASE.)

According to an aspect of the invention, interconnection elements can be pre-fabricated as individual units, for later attachment to electronic components. Various techniques for accomplishing this objective are set forth herein. Although not specifically covered in this document, it is deemed to be relatively straightforward to fabricate a machine that will handle the mounting of a plurality of individual interconnection elements to a substrate or, alternatively, suspending a plurality of individual interconnection elements in an elastomer, or on a support substrate.

It should clearly be understood that the composite interconnection element of the present invention differs dramatically from interconnection elements of the prior art which have been coated to enhance their electrical conductivity characteristics or to enhance their resistance to corrosion.

The overcoating of the present invention is specifically intended to substantially enhance anchoring of the interconnection element to a terminal of an electronic component and/or to impart desired resilient characteristics to the resulting composite interconnection element. In this manner, stresses (contact forces) are directed to portions of the interconnection elements which are specifically intended to absorb the stresses.

It should also be appreciated that the present invention provides essentially a new technique for making spring contacts. Generally, the operative structure of the resulting spring is a product of plating, rather than of bending and shaping. This opens the door to using a wide variety of materials to establish the spring shape, and a variety of "friendly" processes for attaching the "falsework" of the core to electronic components. The overcoating functions as a "superstructure" over the "falsework" of the core, both of which terms have their origins in the field of civil engineering.

A distinct advantage of the present invention is that free-standing spring contacts can be mounted on fragile semiconductor devices without requiring additional hostile techniques, such as brazing or soldering.

According to an aspect of the invention, any of the resilient contact structures may be formed as at least two composite interconnection elements.

Among the benefits of the present invention are:
  (a) the composite interconnection elements (spring contacts) are all metallic, permitting burn-in to be performed at elevated temperatures and, consequently, in a shorter time.
  (b) the composite interconnection elements are free-standing, and are generally not limited by the bond pad layout of semiconductor devices.
  (c) the composite interconnection elements of the present invention can be fashioned to have their tips at a greater pitch (spacing) than their bases, thereby immediately (e.g., at the first level interconnect) commencing and facilitating the process of spreading pitch from semiconductor pitch (e.g., 10 mils) to wiring substrate pitch (e.g., 100 mils).

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. Although the invention will be described in the context of these preferred embodiments, it should be understood that it is not intended to limit the spirit and scope of the invention to these particular embodiments.

Figure 1A:
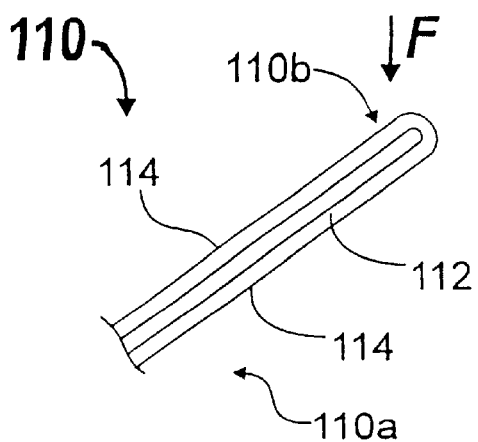
FIG. 1A is a cross-sectional view of a longitudinal portion, including one end, of an interconnection element, according to an embodiment of the invention.

In the side views presented herein, often portions of the side view are presented in cross-section, for illustrative clarity. For example, in many of the views, the wire stem is shown full, as a bold line, while the overcoat is shown in true cross-section (often without crosshatching).

In the figures presented herein, the size of certain elements are often exaggerated (not to scale, vis-a-vis other elements in the figure), for illustrative clarity.

DETAILED DESCRIPTION OF THE INVENTION

This patent application is directed to techniques of providing electronic components such as semiconductor devices with spring contacts, such as for testing (including exercising and performing burn-in) semiconductor devices while they are resident on a semiconductor wafer (i.e., prior to their being singulated from the wafer). As will be evident from the description that follows, the techniques involve fabricating resilient contact structures upon carrier substrates which are attached to the semiconductor devices, making pressure connections to the resilient contact structures for testing the semiconductor devices, and using the same resilient contact structures to connect to the semiconductor die after it is singulated from the wafer. Preferably, the resilient contact structures are implemented as "composite interconnection elements", such as have been described in the disclosure of the aforementioned U.S. patent application Ser. No. 08/452,255, filed May 26, 1995 ("PARENT CASE"), incorporated by reference herein. This patent application summarizes several of the techniques disclosed in the PARENT CASE in the discussions of FIGS. 1A–1E and 2A–2I.

An important aspect of the preferred technique for practicing the present invention is that a "composite" interconnection element can be formed by starting with a core (which may be mounted to a terminal of an electronic component), then overcoating the core with an appropriate material to: (1) establish the mechanical properties of the resulting composite interconnection element; and/or (2) when the interconnection element is mounted to a terminal of an electronic component, securely anchor the interconnection element to the terminal. In this manner, a resilient interconnection element (spring element) can be fabricated, starting with a core of a soft material which is readily shaped into a springable shape and which is readily attached to even the most fragile of electronic components. In light of prior art techniques of forming spring elements from hard materials, is not readily apparent, and is arguably counter-intuitive, that soft materials can form the basis of spring elements. Such a "composite" interconnection element is generally the preferred form of resilient contact structure for use in the embodiments of the present invention.

FIGS. 1A, 1B, 1C and 1D illustrate, in a general manner, various shapes for composite interconnection elements, according to the present invention.

In the main, hereinafter, composite interconnection elements which exhibit resiliency are described. However, it should be understood that non-resilient composite interconnection elements fall within the scope of the invention.

Further, in the main hereinafter, composite interconnection elements that have a soft (readily shaped, and amenable to affixing by friendly processes to electronic components) core, overcoated by hard (springy) materials are described. It is, however, within the scope of the invention that the core can be a hard material the overcoat serving primarily to securely anchor the interconnection element to a terminal of an electronic component.

In FIG. 1A, an electrical interconnection element 110 includes a core 112 of a "soft" material (e.g., a material having a yield strength of less than 40,000 psi), and a shell (overcoat) 114 of a "hard" material (e.g., a material having a yield strength of greater than 80,000 psi). The core 112 is an elongate element shaped (configured) as a substantially straight cantilever beam, and may be a wire having a diameter of 0.0005–0.0030 inches (0.001 inch=1 mil≈25 microns ($\mu$m)). The shell 114 is applied over the already-shaped core 112 by any suitable process, such as by a suitable plating process (e.g., by electrochemical plating).

FIG. 1A illustrates what is perhaps the simplest of spring shapes for an interconnection element of the present invention—namely, a straight cantilever beam oriented at an angle to a force "F" applied at its tip 110b. When such a force is applied by a terminal of an electronic component to which the interconnection element is making a pressure contact, the downward (as viewed) deflection of the tip will evidently result in the tip moving across the terminal, in a "wiping" motion. Such a wiping contact ensures a reliable contact being made between the interconnection element and the contacted terminal of the electronic component.

By virtue of its "hardness", and by controlling its thickness (0.00025–0.00500 inches), the shell 114 imparts a desired resiliency to the overall interconnection element 110. In this manner, a resilient interconnection between electronic components (not shown) can be effected between the two ends 110a and 110b of the interconnection element 110. (In FIG. 1A, the reference numeral 110a indicates an end portion of the interconnection element 110, and the actual end opposite the end 110b is not shown.) In contacting a terminal of an electronic component, the interconnection element 110 would be subjected to a contact force (pressure), as indicated by the arrow labelled "F".

It is generally preferred that the thickness of the overcoat (whether a single layer or a multi-layer overcoat) be thicker than the diameter of the wire being overcoated. Given the fact that the overall thickness of the resulting contact structure is the sum of the thickness of the core plus twice the thickness of the overcoat, an overcoat having the same thickness as the core (e.g., 1 mil) will manifest itself, in aggregate, as having twice the thickness of the core.

The interconnection element (e.g., 110) will deflect in response to an applied contact force, said deflection (resiliency) being determined in part by the overall shape of the interconnection element, in part by the dominant (greater) yield strength of the overcoating material (versus that of the core), and in part by the thickness of the overcoating material.

As used herein, the terms "cantilever" and "cantilever beam" are used to indicate that an elongate structure (e.g., the overcoated core 112) is mounted (fixed) at one end, and the other end is free to move, typically in response to a force acting generally transverse to the longitudinal axis of the elongate element. No other specific or limiting meaning is intended to be conveyed or connoted by the use of these terms.

Figure 1B:
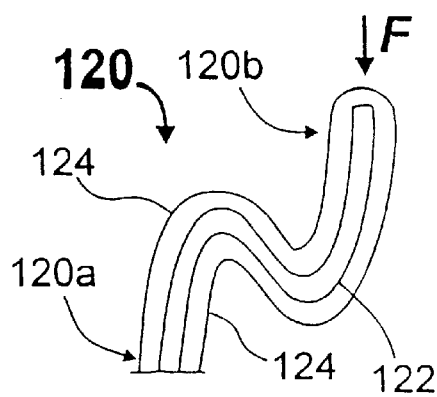
FIG. 1B is a cross-sectional view of a longitudinal portion, including one end, of an interconnection element, according to another embodiment of the invention.

In FIG. 1B, an electrical interconnection element 120 similarly includes a soft core 122 (compare 112) and a hard shell 124 (compare 114) In this example, the core 122 is shaped to have two bends, and thus may be considered to be S-shaped. As in the example of FIG. 1A, in this manner, a resilient interconnection between electronic components (not shown) can be effected between the two ends 120a and 120b of the interconnection element 120. (In FIG. 1B, reference numeral 120a indicates an end portion of the interconnection element 120, and the actual end opposite the end 120b is not shown.) In contacting a terminal of an electronic component, the interconnection element 120 would be subjected to a contact force (pressure), as indicated by the arrow labelled "F".

Figure 1C:
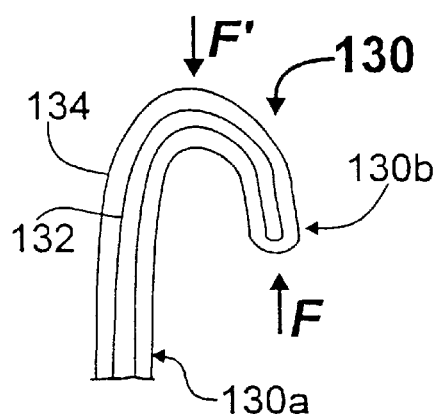
FIG. 1C is a cross-sectional view of a longitudinal portion, including one end of an interconnection element, according to another embodiment of the invention.

In FIG. 1C, an electrical interconnection element 130 similarly includes a soft core 132 (compare 112) and a hard shell 134 (compare 114) In this example, the core 132 is shaped to have one bend, and may be considered to be U-shaped. As in the example of FIG. 1A, in this manner, a resilient interconnection between electronic components (not shown) can be effected between the two ends 130a and 130b of the interconnection element 130. (In FIG. 1C, the reference numeral 130a indicates an end portion of the interconnection element 130, and the actual end opposite the end 130b is not shown.) In contacting a terminal of an electronic component, the interconnection element 130 could be subjected to a contact force (pressure), as indicated by the arrow labelled "F". Alternatively, the interconnection element 130 could be employed to make contact at other than its end 130b, as indicated by the arrow labelled "F'".

Figure 1D:
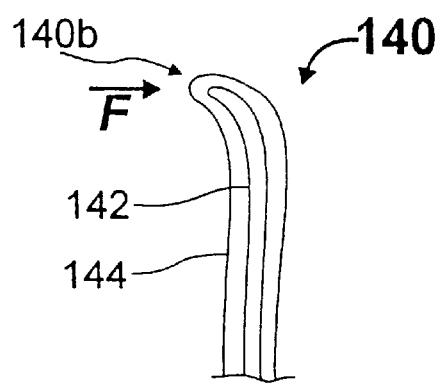
FIG. 1D is a cross-sectional view of a longitudinal portion, including one end of an interconnection element, according to another embodiment of the invention.

FIG. 1D illustrates another embodiment of a resilient interconnection element 140 having a soft core 142 and a hard shell 144. In this example, the interconnection element 140 is essentially a simple cantilever (compare FIG. 1A), with a curved tip 140b, subject to a contact force "F" acting transverse to its longitudinal axis.

Figure 1E:
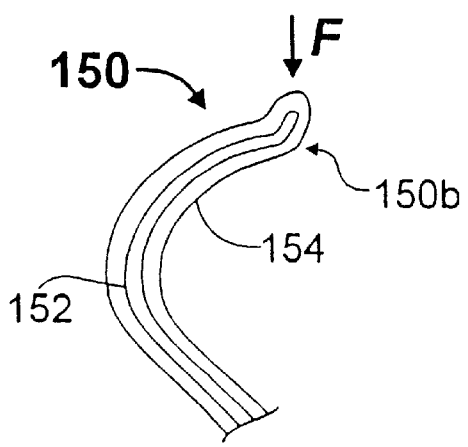
FIG. 1E is a cross-sectional view of a longitudinal portion, including one end of an interconnection element, according to another embodiment of the invention.

FIG. 1E illustrates another embodiment of a resilient interconnection element 150 having a soft core 152 and a hard shell 154. In this example, the interconnection element 150 is generally "C-shaped", preferably with a slightly curved tip 150b, and is suitable for making a pressure contact as indicated by the arrow labelled "F".

It should be understood that the soft core can readily be formed into any springable shape—in other words, a shape that will cause a resulting interconnection element to deflect resiliently in response to a force applied at its tip. For example, the core could be formed into a conventional coil shape. However, a coil shape would not be preferred, due to the overall length of the interconnection element and inductances (and the like) associated therewith and the adverse effect of same on circuitry operating at high frequencies (speeds).

The material of the shell, or at least one layer of a multi-layer shell (described hereinbelow) has a significantly higher yield strength than the material of the core. Therefore, the shell overshadows the core in establishing the mechanical characteristics (e.g., resiliency) of the resulting interconnection structure. Ratios of shell:core yield strengths are preferably at least 2:1, including at least 3:1 and at least 5:1, and may be as high as 10:1. It is also evident that the shell, or at least an outer layer of a multi-layer shell should be electrically conductive, notably in cases where the shell covers the end of the core. (The parent case, however, describes embodiments where the end of the core is exposed, in which case the core must be conductive.)

From an academic viewpoint, it is only necessary that the springing (spring shaped) portion of the resulting composite interconnection element be overcoated with the hard material. From this viewpoint, it is generally not essential that both of the two ends of the core be overcoated. As a practical matter, however, it is preferred to overcoat the entire core. Particular reasons for and advantages accruing to overcoating an end of the core which is anchored (attached) to an electronic component are discussed in greater detail hereinbelow.

Suitable materials for the core (112, 122, 132, 142) include, but are not limited to: gold, aluminum, copper, and their alloys. These materials are typically alloyed with small amounts of other metals to obtain desired physical properties, such as with beryllium, cadmium, silicon, magnesium, and the like. It is also possible to use silver, palladium, platinum; metals or alloys such as metals of the platinum group of elements. Solder constituted from lead, tin, indium, bismuth, cadmium, antimony and their alloys can be used.

Vis-a-vis attaching an end of the core (wire) to a terminal of an electronic component (discussed in greater detail hereinbelow), generally, a wire of any material (e.g., gold) that is amenable to bonding (using temperature, pressure and/or ultrasonic energy to effect the bonding) would be suitable for practicing the invention. It is within the scope of this invention that any material amenable to overcoating (e.g., plating), including non-metallic material, can be used for the core.

Suitable materials for the shell (114, 124, 134, 144) include (and, as is discussed hereinbelow, for the individual layers of a multi-layer shell), but are not limited to: nickel, and its alloys; copper, cobalt, iron, and their alloys; gold (especially hard gold) and silver, both of which exhibit excellent current-carrying capabilities and good contact resistivity characteristics; elements of the platinum group; noble metals; semi-noble metals and their alloys, particularly elements of the platinum group and their alloys; tungsten and molybdenum. In cases where a solder-like finish is desired, tin, lead, bismuth, indium and their alloys can also be used.

The technique selected for applying these coating materials over the various core materials set forth hereinabove will, of course, vary from application-to-application. Electroplating and electroless plating are generally preferred techniques. Generally, however, it would be counter-intuitive to plate over a gold core. According to an aspect of the invention, when plating (especially electroless plating) a nickel shell over a gold core, it is desirable to first apply a thin copper initiation layer over the gold wire stem, in order to facilitate plating initiation.

An exemplary interconnection element, such as is illustrated in FIGS. 1A–1E may have a core diameter of approximately 0.001 inches and a shell thickness of 0.001 inches—the interconnection element thus having an overall diameter of approximately 0.003 inches (i.e., core diameter plus two times the shell thickness). Generally, this thickness of the shell will be on the order of 0.2–5.0 (one-fifth to five) times the thickness (e.g., diameter) of the core.

Some exemplary parameters for composite interconnection elements are:

(a) A gold wire core having a diameter of 1.5 mils is shaped to have an overall height of 40 mils and a generally C-shape curve (compare FIG. 1E) of 9 mils radius, is plated with 0.75 mils of nickel (overall diameter=1.5+2×0.75=3 mils), and optionally receives a final overcoat of 50 microinches of gold (e.g., to lower and enhance contact resistance). The resulting composite interconnection element exhibits a spring constant (k) of approximately 3–5 grams/mil. In use, 3–5 mils of deflection will result in a contact force of 9–25 grams. This example is useful in the context of a spring element for an interposer.

(b) A gold wire core having a diameter of 1.0 mils is shaped to have an overall height of 35 mils, is plated with 1.25 mils of nickel (overall diameter=1.0+2×1.25=3.5 mils), and optionally receives a final overcoat of 50 microinches of gold. The resulting composite interconnection element exhibits a spring constant (k) of approximately 3 grams/mil, and is useful in the context of a spring element for a probe.

(c) A gold wire core having a diameter of 1.5 mils is shaped to have an overall height of 20 mils and a generally S-shape curve with radii of approximately 5 mils, is plated with 0.75 mils of nickel or copper (overall diameter=1.5+ 2×0.75 =3 mils) . The resulting composite interconnection element exhibits a spring constant (k) of approximately 2–3 grams/mil, and is useful in the context of a spring element for mounting on a semiconductor device.

The core need not have a round cross-section, but may rather be a flat tab (having a rectangular cross-section) extending from a sheet. It should be understood that, as used herein, the term "tab" is not to be confused with the term "TAB" (Tape Automated Bonding).

Multi-Layer Shells

Figure 2A:
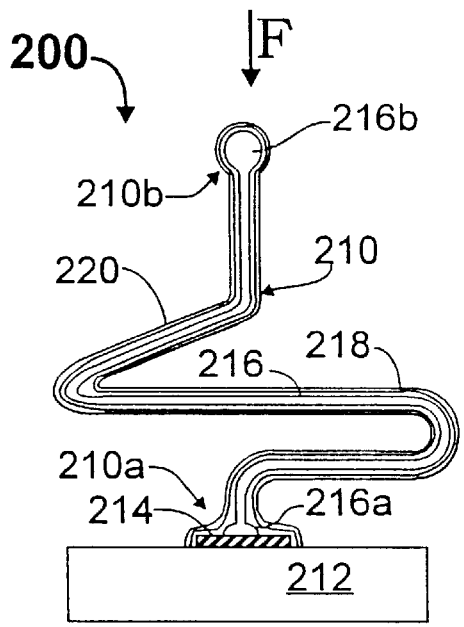
FIG. 2A is a cross-sectional view of an interconnection element mounted to a terminal of an electronic component and having a multi-layered shell, according to the invention.

FIG. 2A illustrates an embodiment 200 of an interconnection element 210 mounted to an electronic component 212 which is provided with a terminal 214. In this example, a soft (e.g., gold) wire core 216 is bonded (attached) at one end 216a to the terminal 214, is configured to extend from the terminal and have a spring shape (compare the shape shown in FIG. 1B), and is severed to have a free end 216b. Bonding, shaping and severing a wire in this manner is accomplished using wirebonding equipment. The bond at the end 216a of the core covers only a relatively small portion of the exposed surface of the terminal 214.

A shell (overcoat) is disposed over the wire core 216 which, in this example, is shown as being multi-layered, having an inner layer 218 and an outer layer 219, both of which layers may suitably be applied by plating processes. One or more layers of the multi-layer shell is (are) formed of a hard material (such as nickel and its alloys) to impart a desired resiliency to the interconnection element 210. For example, the outer layer 219 may be of a hard material, and the inner layer may be of a material that acts as a buffer or barrier layer (or as an activation layer, or as an adhesion layer) in plating the hard material 219 onto the core material 216.

Alternatively, the inner layer 218 may be the hard material, and the outer layer 219 may be a material (such as soft gold) that exhibits superior electrical characteristics, including electrical conductivity and solderability. When a solder or braze type contact is desired, the outer layer of the interconnection element may be lead-tin solder or gold-tin braze material, respectively.

Anchoring to a Terminal

FIG. 2A illustrates, in a general manner, another key feature of the invention—namely, that resilient interconnection element can be securely anchored to a terminal on an electronic component. The attached end 210a of the interconnection element will be subject to significant mechanical stress, as a result of a compressive force (arrow "F") applied to the free end 210b of the interconnection element.

As illustrated in FIG. 2A, the overcoat (218, 219) covers not only the core 216, but also the entire remaining (i.e., other than the bond 216a) exposed surface of the terminal 214 adjacent the core 216 in a continuous (non-interrupted) manner. This securely and reliably anchors the interconnection element 210 to the terminal, the overcoat material providing a substantial (e.g., greater than 50%) contribution to anchoring the resulting interconnection element to the terminal. Generally, it is only required that the overcoat material cover at least a portion of the terminal adjacent the core. It is generally preferred, however, that the overcoat material cover the entire remaining surface of the terminal. Preferably, each layer of the shell is metallic.

As a general proposition, the relatively small area at which the core is attached (e.g., bonded) to the terminal is not well suited to accommodating stresses resulting from contact forces ("F") imposed on the resulting composite interconnection element. By virtue of the shell covering the entire exposed surface of the terminal (other than in the relatively small area comprising the attachment of the core end 216a to the terminal), the overall interconnection structure is firmly anchored to the terminal. The adhesion strength, and ability to react contact forces, of the overcoat will far exceed that of the core end (216a) itself.

As used herein, the term "electronic component" (e.g., 212) includes, but is not limited to: interconnect and interposer substrates; semiconductor wafers and dies, made of any suitable semiconducting material such as silicon (Si) or gallium-arsenide (GaAs); production interconnect sockets; test sockets; sacrificial members, elements and substrates, as described in the parent case; semiconductor packages, including ceramic and plastic packages, and chip carriers; and connectors.

The interconnection element of the present invention is particularly well suited for use as:

interconnection elements mounted directly to silicon dies, eliminating the need for having a semiconductor package;

interconnection elements extending as probes from substrates (described in greater detail hereinbelow) for testing electronic components; and interconnection elements of interposers (discussed in greater detail hereinbelow).

The interconnection element of the present invention is unique in that it benefits from the mechanical characteristics (e.g., high yield strength) of a hard material without being limited by the attendant typically poor bonding characteristic of hard materials. As elaborated upon in the parent case, this is made possible largely by the fact that the shell (overcoat) functions as a "superstructure" over the "falsework" of the core, two terms which are borrowed from the milieu of civil engineering. This is very different from plated interconnection elements of the prior art wherein the plating is used as a protective (e.g., anti-corrosive) coating, and is generally incapable of imparting the desired mechanical characteristic to the interconnection structure. And this is certainly in marked contrast to any non-metallic, anticorrosive coatings, such as benzotriazole (BTA) applied to electrical interconnects.

Among the numerous advantages of the present invention are that a plurality of free-standing interconnect structures are readily formed on substrates, from different levels thereof such as a PCB having a decoupling capacitor) to a common height above the substrate, so that their free ends are coplanar with one another. Additionally, both the electrical and mechanical (e.g., plastic and elastic) characteristics of an interconnection element formed according to the invention are readily tailored for particular applications. For example, it may be desirable in a given application that the interconnection elements exhibit both plastic and elastic deformation. (Plastic deformation may be desired to accommodate gross non-planarities in components being interconnected by the interconnection elements.) When elastic behavior is desired, it is necessary that the interconnection element generate a threshold minimum amount of contact force to effect a reliable contact. It is also advantageous that the tip of the interconnection element makes a wiping contact with a terminal of an electronic component, due to the occasional presence of contaminant films on the contacting surfaces.

As used herein, the term "resilient", as applied to contact structures, implies contact structures (interconnection elements) that exhibit primarily elastic behavior in response to an applied load (contact force), and the term "compliant" implies contact structures (interconnection elements) that exhibit both elastic and plastic behavior in response to an applied load (contact force). As used herein, a "compliant" contact structure is a "resilient" contact structure. The composite interconnection elements of the present invention are a special case of either compliant or resilient contact structures.

A number of features are elaborated upon in detail, in the parent case, including, but not limited to: fabricating the interconnection elements on sacrificial substrates; gang-transferring a plurality of interconnection elements to an electronic component; providing the interconnection elements with contact tips, preferably with a rough surface finish; employing the interconnection elements on an electronic component to make temporary, then permanent connections to the electronic component; arranging the interconnection elements to have different spacing at their one ends than at their opposite ends; fabricating spring clips and alignment pins in the same process steps as fabricating the interconnection elements; employing the interconnection elements to accommodate differences in thermal expansion between connected components; eliminating the need for discrete semiconductor packages (such as for SIMMs); and optionally soldering resilient interconnection elements (resilient contact structures).

Controlled Impedance

Figure 2B:
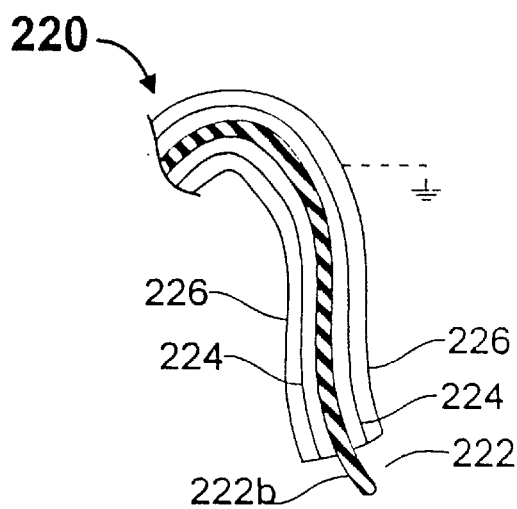
FIG. 2B is a cross-sectional view of an interconnection element having a multi-layered shell, wherein an intermediate layer is of a dielectric material, according to the invention.

FIG. 2B shows a composite interconnection element 220 having multiple layers. An innermost portion (inner elongate conductive element) 222 of the interconnection element 220 is either an uncoated core or a core which has been overcoated, as described hereinabove. The tip 222b of the innermost portion 222 is masked with a suitable masking material (not shown). A dielectric layer 224 is applied over the innermost portion 222 such as by an electrophoretic process. An outer layer 226 of a conductive material is applied over the dielectric layer 224.

In use, electrically grounding the outer layer 226 will result in the interconnection element 220 having controlled impedance. An exemplary material for the dielectric layer 224 is a polymeric material, applied in any suitable manner and to any suitable thickness (e.g., 0.1–3.0 mils).

The outer layer 226 may be multi-layer. For example, in instances wherein the innermost portion 222 is an uncoated core, at least one layer of the outer layer 226 is a spring material, when it is desired that the overall interconnection element exhibit resilience.

Altering Pitch

Figure 2C:
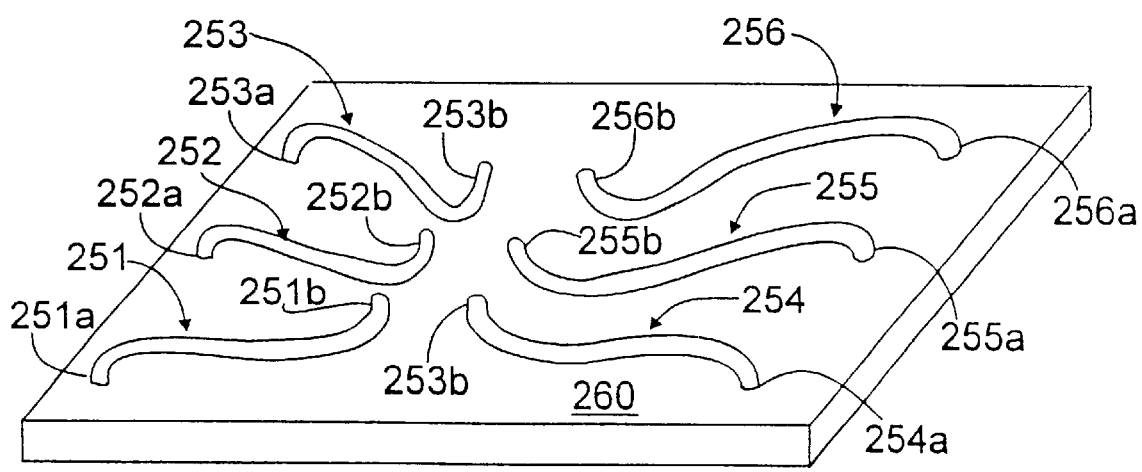
FIG. 2C is a perspective view of a plurality of interconnection elements mounted to an electronic component (e.g., a probe card insert), according to the invention.

FIG. 2C illustrates an embodiment 250 wherein a plurality (six of many shown) of interconnection elements 251 . . . 256 are mounted on a surface of an electronic component 260, such as a probe card insert (a subassembly mounted in a conventional manner to a probe card). Terminals and conductive traces of the probe card insert are omitted from this view, for illustrative clarity. The attached ends 251a . . . 256a of the interconnection elements 251 . . . 256 originate at a first pitch (spacing), such as 0.050–0.100 inches. The interconnection elements 251 . . . 256 are shaped and/or oriented so that their free ends (tips) are at a second, finer pitch, such as 0.005–0.010 inches. An interconnect assembly which makes interconnections from a one pitch to another pitch is typically referred to as a "space transformer".

As illustrated, the tips 251b . . . 256b of the interconnection elements are arranged in two parallel rows, such as for making contact to (for testing and/or burning in) a semiconductor device having two parallel rows of bond pads (contact points). The interconnection elements can be arranged to have other tip patterns, for making contact to electronic components having other contact point patterns, such as arrays.

Generally, throughout the embodiments disclosed herein, although only one interconnection element may be shown, the invention is applicable to fabricating a plurality of interconnection components and arranging the plurality of interconnection elements in a prescribed spatial relationship with one another, such as in a peripheral pattern or in a rectangular array pattern.

Use of Sacrificial Substrates

The mounting of interconnection elements directly to terminals of electronic components has been discussed hereinabove. Generally speaking, the interconnection elements of the present invention can be fabricated upon, or mounted to, any suitable surface of any suitable substrate, including sacrificial substrates.

Attention is directed to the PARENT CASE, which describes, for example with respect to FIGS. 11A–11F fabricating a plurality of interconnection structures (e.g., resilient contact structures) as separate and distinct structures for subsequent mounting to electronic components, and which describes with respect to FIGS. 12A–12C mounting a plurality of interconnection elements to a sacrificial substrate (carrier) then transferring the plurality of interconnection elements en masse to an electronic component.

Figure 2D:
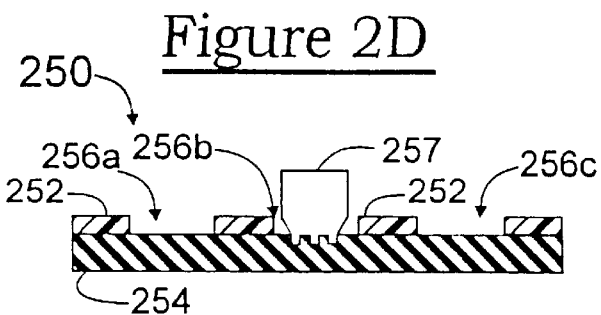
FIG. 2D is a cross-sectional view of an exemplary first step of a technique for manufacturing interconnection elements, according to the invention.
Figure 2E:
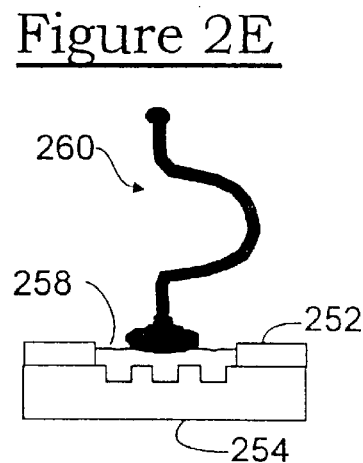
FIG. 2E is a cross-sectional view of an exemplary further step of the technique of FIG. 2D for manufacturing interconnection elements, according to the invention.
Figure 2F:
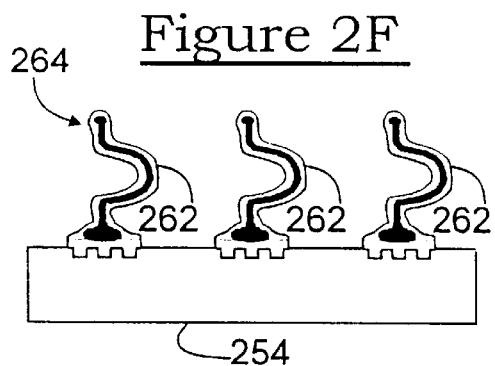
FIG. 2F is a cross-sectional view of an exemplary further step of the technique of FIG. 2E for manufacturing interconnection elements, according to the invention.

FIGS. 2D–2F illustrate a technique for fabricating a plurality of interconnection elements having preformed tip structures, using a sacrificial substrate.

FIG. 2D illustrates a first step of the technique 250, in which a patterned layer of masking material 252 is applied onto a surface of a sacrificial substrate 254. The sacrificial substrate 254 may be of thin (1–10 mil) copper or aluminum foil, by way of example, and the masking material 252 may be common photoresist. The masking layer 252 is patterned to have a plurality (three of many shown) of openings at locations 256*a*, 256*b*, 256*c* whereat it is desired to fabricate interconnection elements. The locations 256*a*, 256*b* and 256*c* are, in this sense, comparable to the terminals of an electronic component. The locations 256*a*, 256*b* and 256*c* are preferably treated at this stage to have a rough or featured surface texture. As shown, this may be accomplished mechanically with an embossing tool 257 forming depressions in the foil 254 at the locations 256*a*, 256*b* and 256*c*. Alternatively, the surface of the foil at these locations can be chemically etched to have a surface texture. Any technique suitable for effecting this general purpose is within the scope of this invention, for example sand blasting, peening and the like.

Next, a plurality (one of many shown) of conductive tip structures 258 are formed at each location (e.g., 256*b*), as illustrated by FIG. 2E. This may be accomplished using any suitable technique, such as electroplating, and may include tip structures having multiple layers of material. For example, the tip structure 258 may have a thin (e.g., 10–100 microinch) barrier layer of nickel applied onto the sacrificial substrate, followed by a thin (e.g., 10 microinch) layer of soft gold, followed by a thin (e.g., 20 microinch) layer of hard gold, followed by a relatively thick (e.g., 200 microinch) layer of nickel, followed by a final thin (e.g., 100 microinch) layer of soft gold. Generally, the first thin barrier layer of nickel is provided to protect the subsequent layer of gold from being "poisoned" by the material (e.g., aluminum, copper) of the substrate 254, the relatively thick layer of nickel is to provide strength to the tip structure, and the final thin layer of soft gold provides a surface which is readily bonded to. The invention is not limited to any particulars of how the tip structures are formed on the sacrificial substrate, as these particulars would inevitably vary from application-to-application.

As illustrated by FIG. 2E, a plurality (one of many shown) of cores 260 for interconnection elements may be formed on the tip structures 258, such as by any of the techniques of bonding a soft wire core to a terminal of an electronic component described hereinabove. The cores 260 are then overcoated with a preferably hard material 262 in the manner described hereinabove, and the masking material 252 is then removed, resulting in a plurality (three of many shown) of free-standing interconnection elements 264 mounted to a surface of the sacrificial substrate, as illustrated by FIG. 2F.

In a manner analogous to the overcoat material covering at least the adjacent area of a terminal (214) described with respect to FIG. 2A, the overcoat material 262 firmly anchors the cores 260 to their respective tip structures 258 and, if desired, imparts resilient characteristics to the resulting interconnection elements 264. As noted in the PARENT CASE, the plurality of interconnection elements mounted to the sacrificial substrate may be gang-transferred to terminals of an electronic component. Alternatively, two widely divergent paths may be taken.

It is within the scope of this invention that a silicon wafer can be used as the sacrificial substrate upon which tip structures are fabricated, and that tip structures so fabricated may be joined (e.g., soldered, brazed) to resilient contact structures which already have been mounted to an electronic component.

Figure 2G:
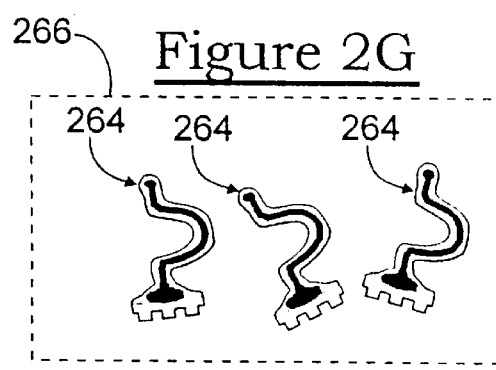
FIG. 2G is a cross-sectional view of an exemplary plurality of individual interconnection elements fabricated according to the technique of FIGS. 2D–2F, according to the invention.

As illustrated by FIG. 2G, the sacrificial substrate 254 may simply be removed, by any suitable process such as selective chemical etching. Since most selective chemical etching processes will etch one material at a much greater rate than an other material, and the other material may slightly be etched in the process, this phenomenon is advantageously employed to remove the thin barrier layer of nickel in the tip structure contemporaneously with removing the sacrificial substrate. However, if need be, the thin nickel barrier layer can be removed in a subsequent etch step. This results in a plurality (three of many shown) of individual, discrete, singulated interconnection elements 264, as indicated by the dashed line 266, which may later be mounted (such as by soldering or brazing) to terminals on electronic components.

It bears mention that the overcoat material may also be slightly thinned in the process of removing the sacrificial substrate and/or the thin barrier layer. However, it is preferred that this not occur.

To prevent thinning of the overcoat, it is preferred that a thin layer of gold or, for example, approximately 10 microinches of soft gold applied over approximately 20 microinches of hard gold, be applied as a final layer over the overcoat material 262. Such an outer layer of gold is intended primarily for its superior conductivity, contact resistance, and solderability, and is generally highly impervious to most etching solutions contemplated to be used to remove the thin barrier layer and the sacrificial substrate.

Figure 2H:
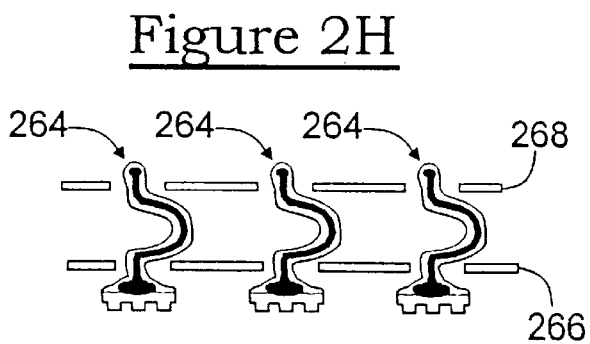
FIG. 2H is a cross-sectional view of an exemplary plurality of interconnection elements fabricated according to the technique of FIGS. 2D–2F, and associated in a prescribed spatial relationship with one another, according to the invention.

Alternatively, as illustrated by FIG. 2H, prior to removing the sacrificial substrate 254, the plurality (three of many shown) of interconnection elements 264 may be "fixed" in a desired spatial relationship with one another by any suitable support structure 266, such as by a thin plate having a plurality of holes therein, whereupon the sacrificial substrate is removed. The support structure 266 may be of a dielectric material, or of a conductive material overcoated with a dielectric material. Further processing steps (not illustrated) such as mounting the plurality of interconnection elements to an electronic component such as a silicon wafer or a printed circuit board may then proceed. Additionally, in some applications, it may be desireable to stabilize the tips (opposite the tip structures) of the interconnection elements 264 from moving, especially when contact forces are applied thereto. To this end, it may also be desirable to constrain movement of the tips of the interconnection elements with a suitable sheet 268 having a plurality of holes, such as a mesh formed of a dielectric material.

A distinct advantage of the technique 250 described hereinabove is that tip structures (258) may be formed of virtually any desired material and having virtually any desired texture. As mentioned hereinabove, gold is an example of a noble metal that exhibits excellent electrical characteristics of electrical conductivity, low contact resistance, solderability, and resistance to corrosion. Since gold is also malleable, it is extremely well-suited to be a final overcoat applied over any of the interconnection elements described herein, particularly the resilient interconnection elements described herein. Other noble metals exhibit similar desirable characteristics. However, certain materials such as rhodium which exhibit such excellent electrical characteristics would generally be inappropriate for overcoating an entire interconnection element. Rhodium, for example, is notably brittle, and would not perform well as a final overcoat on a resilient interconnection element. In this regard, techniques exemplified by the technique 250 readily overcome this limitation. For example, the first layer of a multi-layer tip structure (see 258) can be rhodium (rather than gold, as described hereinabove), thereby exploiting its superior electrical characteristics for making contact to electronic components without having any impact whatsoever on the mechanical behavior of the resulting interconnection element.

Figure 2I:
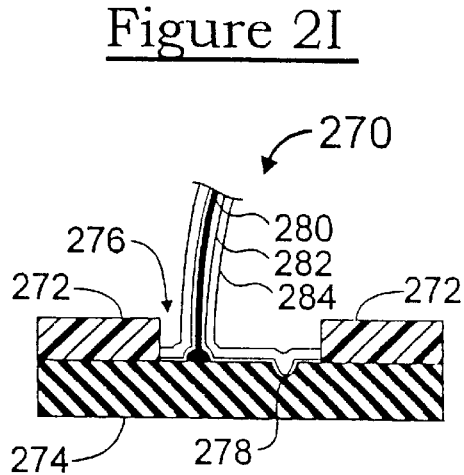
FIG. 2I is a cross-sectional view of an alternate embodiment for manufacturing interconnection elements, showing a one end of one element, according to the invention.

FIG. 2I illustrates an alternate embodiment 270 for fabricating interconnection elements. In this embodiment, a masking material 272 is applied to the surface of a sacrificial substrate 274, and is patterned to have a plurality (one of many shown) of openings 276, in a manner similar to the technique described hereinabove with respect to FIG. 2D. The openings 276 define areas whereat interconnection elements will be fabricated as free-standing structures. (As used throughout the descriptions set forth herein, an interconnection element is "free-standing" when is has a one end bonded to a terminal of an electronic component or to an area of a sacrificial substrate, and the opposite end of the interconnection element is not bonded to the electronic component or sacrificial substrate.)

The area within the opening may be textured, in any suitable manner, such as to have one or more depressions, as indicated by the single depression 278 extending into the surface of the sacrificial substrate 274.

A core (wire stem) 280 is bonded to the surface of the sacrificial substrate within the opening 276, and may have any suitable shape. In this illustration, only a one end of one interconnection element is shown, for illustrative clarity. The other end (not shown) may be attached to an electronic component. It may now readily be observed that the technique 270 differs from the aforementioned technique 250 in that the core 280 is bonded directly to the sacrificial substrate 274, rather than to a tip structure 258. By way of example, a gold wire core (280) is readily bonded, using conventional wirebonding techniques, to the surface of an aluminum substrate (274).

In a next step of the process (270), a layer 282 of gold is applied (e.g., by plating) over the core 280 and onto the exposed area of the substrate 274 within the opening 276, including within the depression 278. The primary purpose of this layer 282 is to form a contact surface at the end of the resulting interconnection element (i.e., once the sacrificial substrate is removed).

Next, a layer 284 of a relatively hard material, such as nickel, is applied over the layer 282. As mentioned hereinabove, one primary purpose of this layer 284 is to impart desired mechanical characteristics (e.g., resiliency) to the resulting composite interconnection element. In this embodiment, another primary purpose of the layer 284 is to enhance the durability of the contact surface being fabricated at the lower (as viewed) end of the resulting interconnection element. A final layer of gold (not shown) may be applied over the layer 284, to enhance the electrical characteristics of the resulting interconnection element.

In a final step, the masking material 272 and sacrificial substrate 274 are removed, resulting in either a plurality of singulated interconnection elements (compare FIG. 2G) or in a plurality of interconnection elements having a predetermined spatial relationship with one another (compare FIG. 2H).

This embodiment 270 is exemplary of a technique for fabricating textured contact tips on the ends of interconnection elements. In this case, an excellent example of a "gold over nickel" contact tip has been described. It is, however, within the scope of the invention that other analogous contact tips could be fabricated at the ends of interconnection elements, according to the techniques described herein. Another feature of this embodiment 270 is that the contact tips are constructed entirely atop the sacrificial substrate (274), rather than within the surface of the sacrificial substrate (254) as contemplated by the previous embodiment 250.

Mounting Spring Interconnect Elements Directly to Semiconductor Devices

Figure 3A:
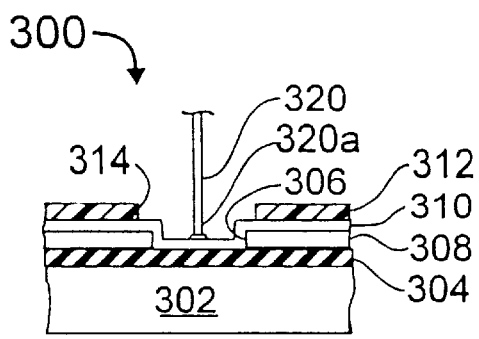
FIG. 3A is a side view of a wire having its free end bonded to a metal layer applied to a substrate, through an opening in a photoresist layer, according to the present invention.
Figure 3B:
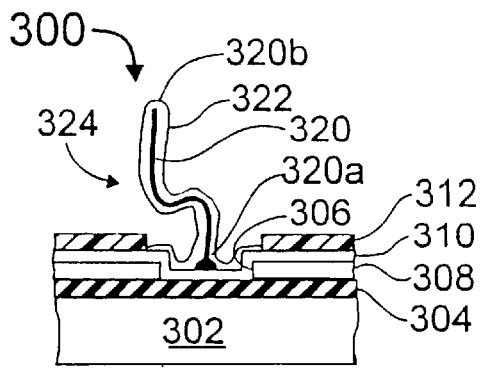
FIG. 3B is a side view of the substrate of FIG. 3A, with the wire overcoated, according to the present invention.
Figure 3C:
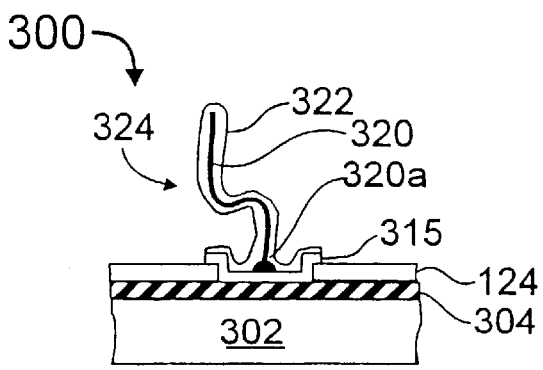
FIG. 3C is a side view of the substrate of FIG. 3B, with the photoresist layer removed and the metal layer partially removed, according to the present invention.

FIGS. 3A, 3B, and 3C are comparable to FIGS. 1C–1E of the PARENT CASE, and illustrate a technique 300 for fabricating composite interconnections directly upon semiconductor devices, including unsingulated semiconductor devices. This technique is comparable to a technique disclosed in the aforementioned commonly-owned, copending U.S. patent application Ser. No. 08/558,332.

According to conventional semiconductor processing techniques, a semiconductor device 302 has a patterned conductive layer 304. This layer 304 may be a top metal layer, which is normally intended for bond-out to the die, as defined by openings 306 in an insulating (e.g., passivation) layer 308 (typically nitride). In this manner, a bond pad would be defined which would have an area corresponding to the area of the opening 306 in the passivation layer 308. Normally (i.e., according to the prior art), a wire would be bonded to the bond pad.

According to the invention, a blanket layer 310 of metal material (e.g., aluminum) is deposited (such as by sputtering) over the passivation layer 308 in a manner that the conductive layer 310 conformally follows the topography of the layer 308, including "dipping" into the opening 306 and electrically contacting the layer 304. A patterned layer 312 of masking material (e.g., photoresist) is applied over the layer 310 with openings 314 aligned over the openings 306 in the passivation layer 308. Portions of the blanket conductive layer 310 are covered by the masking material 312, other portions of the blanket conductive layer 310 are exposed (not covered) within the openings 314 of the layer of masking material 312. The exposed portions of the blanket conductive layer 310, within the openings 314 will serve as "pads" or "terminals" (compare 214), and may be gold plated (not shown).

An important feature of this technique is that the opening 314 is larger than the opening 306. As will be evident, this will result in a larger bond area (defined by the opening 132) than is otherwise (as defined by the opening 306) present on the semiconductor die 302.

Another important feature of this technique is that the conductive layer 310 acts as a shorting layer to protect the device 302 from damage during a process of electronic flame off (EFO) of the wire stem (core) 320.

An end 320a of an inner core (wire stem) 320 is bonded to the top (as viewed) surface of the conductive layer 310, within the opening 314. The core 320 is configured to extend from the surface of the semiconductor die, to have a springable shape and is severed to have a tip 320b, in the manner described hereinabove (e.g., by electronic flame off). Next, as shown in FIG. 3B, the shaped wire stem 320 is overcoated with one or more layers of conductive material 322, as described hereinabove (compare FIG. 2A). In FIG. 3B it can be seen that the overcoat material 322 completely envelops the wire stem 320 and also covers the conductive layer 310 within the area defined by the opening 314 in the photoresist 312.

The photoresist 312 is then removed (such as by chemical etching, or washing), and the substrate is subjected to selective etching (e.g., chemical etching) to remove all of the material from the conductive layer 310 except that portion 315 (e.g., pad, terminal) of the layer 310 which is covered by the material 322 overcoating the wire stem 320. Portions of the blanket conductive layer 310 previously covered by the masking material 312, and not overcoated with the material 322, are removed in this step, while the remaining portions of the blanket conductive material 310 which have been overcoated by the material 322 are not removed. This results in the structure shown in FIG. 3C, a significant advantage of which is that the resulting composite interconnection element 324 is securely anchored (by the coating material 322) to an area (which was defined by the opening 314 in the photoresist) which can easily be made to be larger than what would otherwise (e.g., in the prior art) be considered to be the contact area of a bond pad (i.e., the opening 306 in the passivation layer 308).

Another important advantage of this technique is that a hermetically-sealed (completely overcoated) connection is effected between the contact structure 324 and the terminal (pad) 315 to which it is mounted.

The techniques described hereinabove generally set forth a novel method for fabricating composite interconnection elements, the physical characteristics of which are readily tailored to exhibit a desired degree of resiliency.

Generally, the composite interconnection elements of the present invention are readily mounted to (or fabricated upon) a substrate (particularly a semiconductor die) in a manner in which the tips (e.g., 320b) of the interconnection elements (e.g., 320) are readily caused to be coplanar with one another and can be at a different (e.g., greater pitch) than the terminals (e.g., bond pads) from which they originate.

It is within the scope of this invention that openings are made in the resist (e.g., 314) whereat resilient contact structures are not mounted. Rather, such openings could advantageously be employed to effect connections (such as by traditional wirebonding) to other pads on the same semiconductor die or on other semiconductor dies. This affords the manufacturer the ability to "customize" interconnections with a common layout of openings in the resist.

Figure 3D:
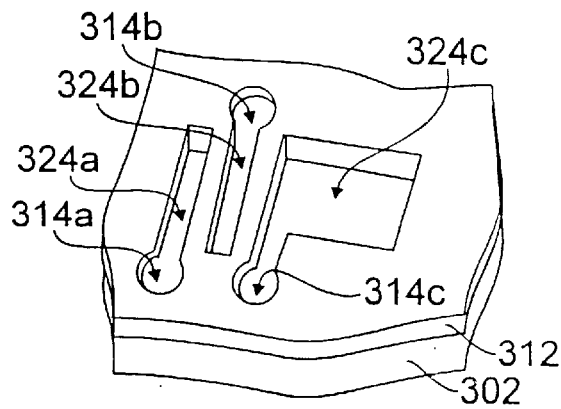
FIG. 3D is a perspective view of a semiconductor device, formed according to the techniques set forth in FIGS. 3A–3C, according to the present invention.

As shown in FIG. 3D, it is within the scope of this invention that the masking layer 312 can additionally be patterned, so as to leave additional conductive lines or areas upon the face of the semiconductor device 302 (i.e., in addition to providing openings 314 whereat the interconnection elements 324 are mounted and overcoated). This is illustrated in the figure by the "elongate" openings 324a and 324b extending to the openings 314a and 314b, respectively, and the "area" opening 324c optionally (as shown) extending to the opening 314c. (In this figure, elements 304, 308 and 310 are omitted, for illustrative clarity.) As set forth hereinabove, the overcoat material 322 will be deposited in these additional openings (324a, 324b, 324c), and will prevent portions of the conductive layer 310 underlying these openings from being removed. In the case of such elongated and area openings (324a, 324b, 324c) extending to contact openings (314a, 314b, 314c), the elongated and area openings will be electrically connected to corresponding ones of the contact structures. This is useful in the context of providing (routing) conductive traces between (interconnecting) two or more terminals (315) directly upon the face of the electronic component (e.g., semiconductor device) 302. This is also useful for providing ground and/or power planes directly upon the electronic component 302. This is also useful in the context of closely adjacent (e.g., interleaved) elongated areas (which when plated, become lines), such as the elongated areas 324a and 324b, which can serve as on-chip (302) capacitors. Additionally, providing openings in the masking layer 312 at other than the locations of the contact structures 324 can help uniformize deposition of the subsequent overcoat material 322.

It is within the scope of this invention that the contact structures (324) are pre-fabricated, for example in the manner of FIGS. 2D–2F described hereinabove, and brazed to the terminals 315, either with or without tips (258) having controlled topography. This includes mounting the pre-fabricated contact structures to unsingulated (from a semiconductor wafer) semiconductor dies on a one-by-one basis, or several semiconductor dies at once. Additionally, the topography of a tip structure (258) can be controlled to be flat, to make an effective pressure connection with a z-axis conductive adhesive (868), such as is described in the PARENT CASE and in commonly-owned, copending U.S. patent application Ser. No. 08/558,332, filed Nov. 15, 1995.

Exercising Semiconductor Devices

A well-known procedure among integrated circuit (chip) manufacturers is the burn-in and functional testing of chips. These techniques are typically performed after packaging the chips, and are collectively referred to herein as "exercising".

Modern integrated circuits are generally produced by creating several, typically identical integrated circuit dies (usually as square or rectangular die sites) on a single (usually round) semiconductor wafer, then scribing and slicing the wafer to separate (singulate, dice) the dies (chips) from one another. An orthogonal grid of "scribe line" (kerf) areas extends between adjacent dies, and sometimes contain test structures, for evaluating the fabrication process. These scribe lines areas, and anything contained within them, will be destroyed when the dies are singulated from the wafer. The singulated (separated) dies are ultimately individually packaged, such as by making wire bond connections between bond pads on the die and conductive traces within the package body.

"Burn-in" is a process whereby a chip (die) is either simply powered up ("static" burn-in), or is powered up and has signals exercising to some degree the functionality of the chip ("dynamic" burn-in). In both cases, burn-in is typically performed at an elevated temperature and by making "temporary" (or removable) connections to the chip—the object being to identify chips that are defective, prior to packaging the chips. Burn-in is usually performed on a die-by-die basis, after the dies are singulated (diced) from the wafer, but it is also known to perform burn-in prior to singulating the dies. Typically, the temporary connections to the dies are made by test probes of by "flying wires".

Functional testing can also be accomplished by making temporary connections to the dies. In some instances, each die is provided with built-in self test (self-starting, signal-generating) circuitry which will exercise some of the functionality of the chip. In many instances, a test jig must be fabricated for each die, with probe pins precisely aligned with bond pads on the particular die required to be exercised (tested and/or burned-in). These test jigs are relatively expensive, and require an inordinate amount of time to fabricate.

As a general proposition, package leads are optimized for assembly, not for burn-in (or functional testing). Prior art burn-in boards are costly, and are often subjected to thousands of cycles (i.e., generally one cycle per die that is tested). Moreover, different dies require different burn-in boards. Burn-in boards are expensive, which increases the overall cost of fabrication and which can only be amortized over large runs of particular devices.

Given that there has been some testing of the die prior to packaging the die, the die is packaged in order that the packaged die can be connected to external system components. As described hereinabove, packaging typically involves making some sort of "permanent" connection to the die, such as by bond wires. (Often, such "permanent" connections may be un-done and re-done, although this is not generally desirable.)

Evidently, the "temporary" connections required for burn-in and/or pre-packaging testing of the die(s) are often dissimilar from the "permanent" connections required for packaging the die (s).

Mounting Spring Elements on Carriers which, in turn, are Mounted on and Connected to Electronic Components As mentioned hereinabove (e.g., with respect to FIGS. 3A–3C), it is possible to mount the resilient contact structures of the present invention directly to (on) semiconductor dies. This is particularly significant when viewed against prior art techniques of wire bonding to dies which are disposed in some sort of package requiring external interconnect structures (e.g., pins, leads and the like).

In certain instances, it may not be advantageous, or in some instances possible, to mount spring contacts directly to terminals of a semiconductor die. This calls for alternate techniques of disposing spring contacts upon semiconductor dies. Such techniques are disclosed herein.

Figure 4:
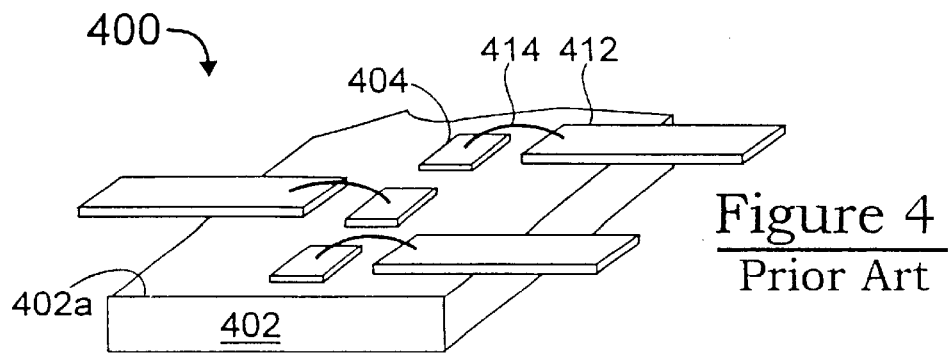
FIG. 4 is a perspective view of a semiconductor device of the prior art.

FIG. 4 illustrates a semiconductor device 400 which comprises a semiconductor die 402 having a plurality of bond pads (terminals) 404 arranged in a row along a centerline of the die 402. (In this, and in subsequent, illustrations, bond pads are shown in a "stylized" manner as being atop the surface of a semiconductor die.) For example, there may be in excess of one hundred such bond pads arranged at a 5 mil pitch. The semiconductor device 400 is exemplary of a 64-megabit memory device. As is known, connections to the device 400 can be made with an LOC (lead on chip) leadframe 410 having a plurality of leadframe fingers 412 extending across the top surface 402a of the die 402 towards respective ones of the bond pads 404. The leadframe fingers 412 are connected to respective ones of the bond pads 404 by bond wires 414. Often, in such devices 400, there are redundancy openings (not shown), or windows, in the passivation layer (not shown) through which the top metallization layer of the semiconductor device is exposed, to permit reconfiguring certain connections internal to the device in order to make otherwise non-functional devices functional.

It would seemingly be straightforward to mount resilient contact structures to the bond pads 404 in the manner described hereinabove with respect to FIGS. 3A–3C. However, often, in such devices 400, there are redundancy openings (not shown), or windows, in the passivation layer (not shown) through which the top metallization layer of the semiconductor device is exposed, to permit reconfiguring certain connections internal to the device in order to make otherwise non-functional devices operative. These redundancy windows (and the exposed metallization) essentially prohibit the deposition (sputtering) of a blanket conductive layer (310).

It is an object of the present invention to provide a technique for mounting resilient contact structures (spring elements) to semiconductor devices without requiring deposition of a blanket conductive layer on the semiconductor device.

According to the invention, a plurality of resilient contact structures (spring elements) are mounted to a rigid carrier substrate, the carrier substrate is mounted to the semiconductor device, and the spring elements are electrically connected to corresponding ones of the bond pads on the semiconductor device.

Figure 5:
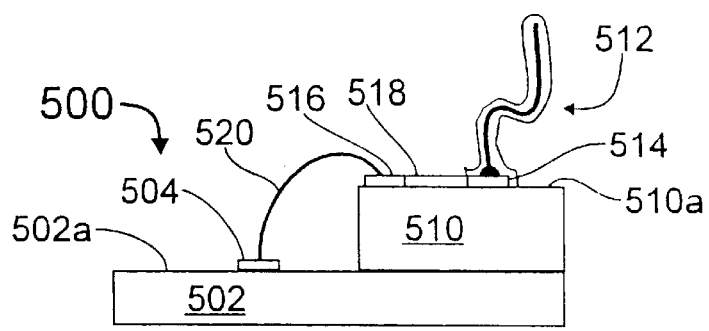
FIG. 5 is a side view of a carrier substrate having spring elements mounted to a semiconductor die, according to an embodiment of the invention.

FIG. 5 is a side view of semiconductor device assembly 500, according to the present invention, and bears some similarity to FIGS. 16E and 16F of the PARENT CASE. As noted therein:

"FIGS. 16E and 16F are side views of a technique for fabricating resilient contact structures in a manner suitable for stacking chips (semiconductor dies), one atop another, according to the present invention."

"FIGS. 16E and 16F illustrate a technique 1650 for fabricating resilient contact structures in a manner suitable for stacking chips (semiconductor dies), one atop another. A sacrificial structure 1652 (compare 1602) is disposed atop a first electronic component 1662 (compare 1612). A wire 1658 is bonded at one end 1658a to a pad 1664 on the first electronic component 1662, is configured to have a springable shape (in a manner similar to that of FIG. 16A), and an intermediate portion 1658c of the wire 1658 is bonded to the sacrificial structure 1652 (without severing). As illustrated, the sacrificial structure 1652 may be provided with a contact tip 1654 (compare 1026 of FIG. 10C) to which the intermediate portion of the wire is bonded. The wire is further shaped to extend from the sacrificial structure 1652 in a springable shape (e.g., compare the S-shape of FIG. 2E), and is severed to have a free end 1658b. The shaped wire stem may be plated either prior to (compare FIG. 16B) or after (compare FIG. 16D) removing the sacrificial structure 1652 to become a resilient contact structure, and may have a topological contact (compare 1026) applied to its free end 1658b."

"After the sacrificial structure 1652 is removed, a second electronic component 1672 is disposed between the first electronic component 1662 and the intermediate portions 1658c of the resilient contact structures (overcoated wire stems) to effect interconnections between the first electronic component 1662 and terminals 1674 of the second electronic component 1672. An advantage of this technique is that the interconnects (overcoated portion of the wire stem between 1658c and 1658b) also extend from the second electronic component 1672, for making connections to external systems (other electronic components). By way of example, the first electronic component 1662 is a microprocessor, and the second electronic component 1672 is a memory device."

The semiconductor device 500 is similar to the semiconductor device 400, in that it comprises a semiconductor die 502 (compare 402) having a plurality of bond pads 504 (compare 404) on its top surface 502a (compare 402a). The bond pads 504 may be arranged in a single row down a centerline of the semiconductor die 502.

A rigid carrier substrate 510 is mounted, using any suitable adhesive (not shown) to the face 502a of the die 502, on an area of the die not occupied by bond pads 504.

The carrier substrate 510 is formed of any suitable, rigid material, such as ceramic, silicon, PCB material (such as Kevlar (tm), FR4, or the like), or metal having an insulating coating. The carrier substrate may also be formed of a polymer.

The adhesive is any suitable adhesive such as thermoplastic or cyanide-ester. It is not required that the adhesive be resilient, or that it allow the carrier substrate 510 to be compressed towards the semiconductor die 502. However, in the case of carrier substrates having a substantially different coefficient of thermal expansion than that of the semiconductor die, it is advantageous to select an adhesive that will accommodate (such as by low shear strength) such differences in coefficients of thermal expansion. The adhesives contemplated to be used to adhere the carrier (e.g., 510) to the substrate (e.g., 502) are suitably thermoplastic, cyanide-ester, epoxy, silicone, or flexible epoxy.

It should be understood that the term "rigid", as applied to the carrier (e.g., 510) denotes that the carrier need not be resilient, and is preferably rigid per se. However, it should be understood that the term "rigid carrier" also applies to a flexible carrier that is adhered to a rigid substrate (e.g., 502) without intervening means for permitting/encouraging the carrier to flex. In this latter case, the mounted carrier would be reinforced (rigidized, in use) by the underlying rigid substrate (e.g., 502).

Prior to mounting the carrier substrate 510 to the semiconductor die 502, a plurality of resilient contact structures (spring elements) 512 are mounted to corresponding ones of a first plurality of terminals 514 on the top (as viewed) surface 510a of the carrier substrate 510. A second plurality of terminals 516 are also provided on the top surface 510a of the carrier substrate 510, and are connected to corresponding ones of the first plurality of terminals 512 by conductive lines 518. The carrier substrate 510 is thus recognizable as a type of wiring substrate, wherein the terminals 514, the terminals 516 and the lines 518 can all be patterned from a single conductive layer. The resilient contact structures (spring elements) 512 are mounted to the terminals 514 in any suitable manner and to have any desired resilient/compliant characteristics, such as has been described hereinabove (e.g., compare FIG. 2A).

After mounting the rigid carrier substrate 510 to the face 502a of the semiconductor die 502, the resilient contact structures (spring elements) 512 are connected to corresponding ones of the bond pads 504 by bond wires 520 extending between the bond pads 504 and the terminals 516. In this manner, a technique is provided for mounting resilient contact structures (spring elements) upon semiconductor devices without requiring deposition of a blanket conductive layer on the semiconductor device. Moreover, the carrier substrate, with spring contacts fabricated thereupon, can be prefabricated for later mounting to semiconductor dies. Additionally, engineering changes in the layout and interconnection of the terminals on the carrier substrate are readily effected prior to mounting the carrier substrate to the semiconductor die.

As noted above, the rigid carrier substrate can be located anywhere on the die other than atop the bond pads. If there are redundancy openings (windows) in the passivation layer of the die, the rigid carrier substrate may be designed and disposed so that it does not overlie the redundancy windows, and can readily be fabricated to avoid such "conflicts", but this is not absolutely necessary. For example, if the die has already been probed (tested), and the necessary modifications thereto made through the exposed redundancy windows (e.g., by "fusing" wiring layers of the die, for re-routing signals), it is acceptable that the carrier overlie the already-used redundancy windows. Generally, the carrier can overlie the redundancy windows if they are no longer needed.

Generally, in the embodiment of FIG. 5 and the embodiments that follow, the carrier substrate (e.g., 510) is disposed between the spring elements (e.g., 512) and the semiconductor die (e.g., 502), and the spring elements extend away from the front surface (e.g., 502a) of the semiconductor die. This forms what can be termed a "semiconductor assembly".

Figure 5A:
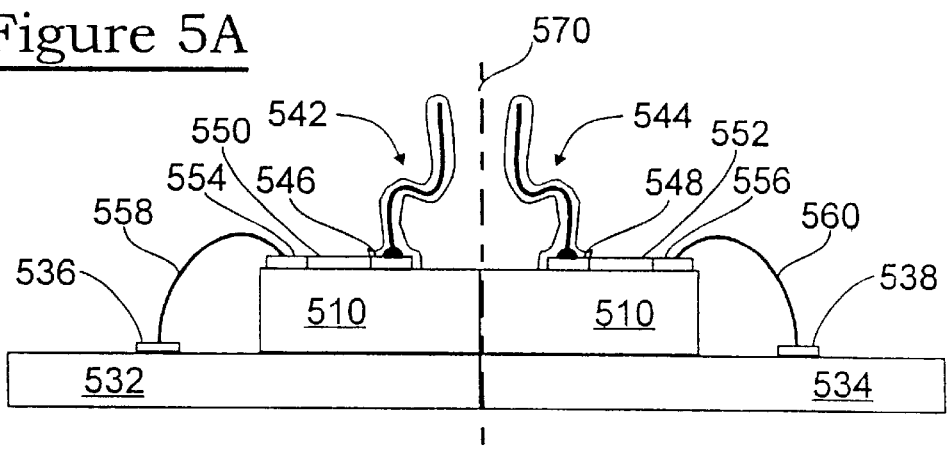
FIG. 5A is a side view of a carrier substrate having spring elements mounted to two unsingulated semiconductor dies, according to an embodiment of the invention.

The technique of FIG. 5 is readily extended to wafer level. FIG. 5A illustrates two of a plurality of semiconductor dies 532 and 534, adjacent one another, which have not been singulated (separated) from a semiconductor wafer. Each die 532 and 534 (compare 502) is provided with a plurality of bond pads 536 and 538 (compare 504), respectively. A single rigid carrier substrate 540 (compare 510) is disposed atop both of the adjacent semiconductor dies 532 and 534, so as to "bridge" (span) the two dies. In other words, the rigid carrier substrate 540 hangs over the edge of either one of the two dies.

In a manner similar to that described hereinabove with respect to FIG. 5, prior to mounting the rigid carrier substrate 540 to the faces of the dies 532 and 534, resilient contact structures (spring elements) 542 and 544 (compare 512) are mounted to first pluralities of terminals 546 and 548 (compare 514), and the terminals 546 and 548 are connected via pluralities of conductive lines 550 and 552 (compare 518), respectively, to second pluralities of terminals 554 and 556 (compare 516), respectively, which are connected by bond wires 558 and 560 (compare 520) to the bond pads 536 and 538, respectively.

In this manner, each semiconductor die is provided with a plurality of spring elements (542, 546) connected to its bond pads (536, 538), said spring elements extending upwards (as viewed) from the surface of the dies. This can be done with all of the dies on a wafer, or with a selected portion of the dies on the wafer. Generally, only one carrier substrate will be required for every two unsingulated dies on the wafer, in the event that the unsingulated dies have central rows of pads. However, it is within the scope of this invention that a single rigid carrier substrate could span any number of adjacent unsingulated dies on a wafer (i.e., by being disposed at the intersection of the four unsingulated dies). Generally, it would be preferred to "pick and place" one carrier per die (on a wafer), or to mount one single very large carrier to the entire wafer of unsingulated dies. This is generally the case for all of the carrier embodiments disclosed herein.

When it is eventually desired to singulate the dies 532 and 534 (such as for final assembly, or packaging thereof), a suitable mechanism (e.g., wafer saw, laser, etc.) can be used to slice along the line 570, between the adjacent unsingulated dies.

As noted in the aforementioned, commonly-owned, copending U.S. patent application Ser. No. 08/558,332:

"The mounting of resilient contact structures to unsingulated dies provides a technique for testing (exercising and/or burning-in) semiconductor dies, prior to their being singulated (separated) from a semiconductor wafer, without being constrained by the arrangement of dies or the layout of bond pads on the dies, with the requisite resiliency and/or compliance being resident on the semiconductor dies, rather than requiring the probe cards to be provided with resilient contact structures extending therefrom, and permits using the same resilient contact structures for final packaging of the semiconductor devices. Moreover, by mounting resilient contact structures (spring elements) to dies, preferably prior to the semiconductor dies being singulated (separated) from a semiconductor wafer, a plurality of pressure contacts can be made to one or more unsingulated semiconductor dies (devices) using a "simple" test board to power-up the semiconductor devices, and the like. (A "simple" test board would be a substrate having a plurality of terminals or electrodes, as contrasted with a traditional "probe card" which is a substrate having a plurality of probe elements extending from a surface thereof. A simple test board is less expensive, and more readily configured than a traditional probe card. Moreover, certain physical constraints inherent in traditional probe cards are not encountered when using a simple test board to make the desired pressure contacts with semiconductor devices.) In this manner, a plurality of unsingulated semiconductor dies can be exercised (tested and/or burned in) prior to the semiconductor dies being singulated (separated) from the wafer. It is of great benefit that the same spring contact elements which are mounted to the semiconductor dies and which are used to exercise the semiconductor dies can be used to make permanent connections to the semiconductor dies after they have been singulated from the wafer."

The technique set forth in FIG. 5A can be implemented with "pick-and-place" equipment which mounts the dies to the carriers, or vice-versa, and is most well suited to semiconductor dies that have a central row of bond pads.

Figure 5B:
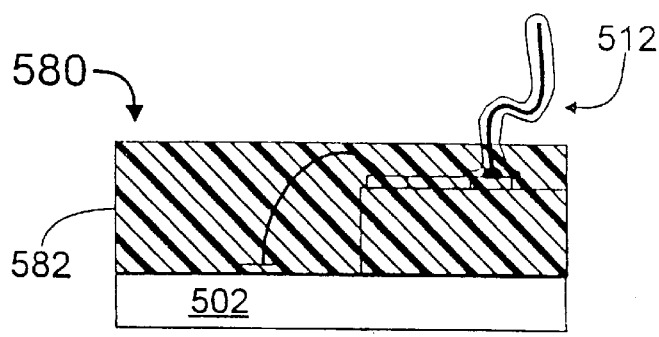
FIG. 5B is a side view of a carrier substrate, of the type illustrated in FIG. 5, according to an embodiment of the invention.

FIG. 5B illustrates a feature 580 of the invention, wherein the carrier of FIG. 5 is mounted in the aforementioned manner to an electronic component 502 (e.g., a semiconductor die) and, in a final step is encapsulated with an encapsulant 582 which extends from the surface of the electronic component and covers the base of the fabricated composite interconnection (spring) element 512. A sufficient amount of encapsulant to accomplish this desired goal is required, but it is not required that the application of the encapsulant 582 be carefully controlled. This technique 580 can be performed either before semiconductor dies are singulated from a semiconductor wafer, or after the are singulated.

Figure 6:
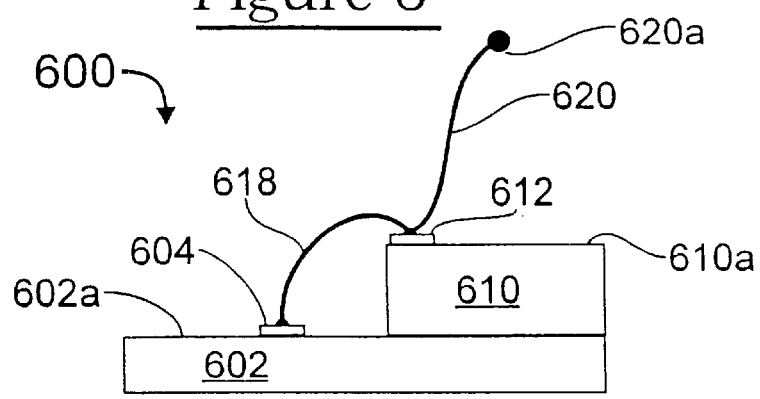
FIG. 6 is a side view of an alternate embodiment of a carrier substrate having spring elements mounted to a semiconductor die, according to he invention.

FIG. 6 illustrates an alternate technique 600 for providing semiconductor dies with spring elements, and is applicable to either unsingulated dies or to singulated dies. As shown therein, a rigid carrier substrate 610 (compare 510 or 540) is mounted (with a suitable adhesive, as described hereinabove) to a surface 602a of a semiconductor die 602. The semiconductor die 602 has a plurality of bond pads 604 disposed on its surface 602a, and the rigid carrier substrate 610 has a corresponding plurality of terminals 612 disposed on its top (as viewed) surface). For each bond pad 604, a bond wire 618 is bonded to the bond pad, is extended, and is bonded to a corresponding terminal 612, without severing the bond wire 618. This forms a connection between the bond pads 604 and corresponding ones of the terminals 612. For each terminal 612, the bond wire 618 is further extended (as portion 620 of the bond wire) to extend from the surface of the carrier substrate 610, and is shaped and severed in the manner described hereinabove (compare FIG. 2A). This provides a free-standing wire stem 620 having a spring shape and a tip 620a. The wire stem 620 is contiguous with the bond wire 618 (i.e., it is one continuous wire which has been bonded at a midportion thereof to the terminal 612).

Figure 6A:
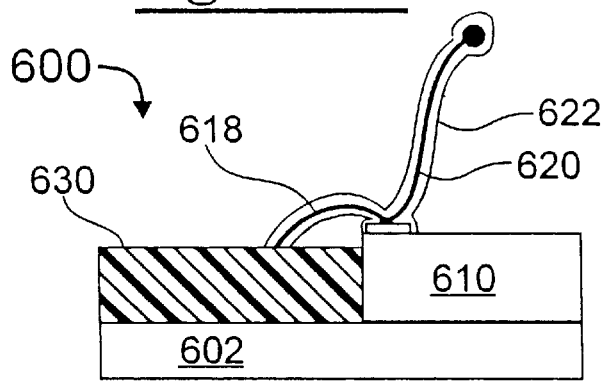
FIG. 6A is a side view of the carrier semiconductor assembly of FIG. 6, according to the invention.

As mentioned hereinabove with respect to providing a blanket conductive layer (310) on the semiconductor die, it may similarly not be feasible (or desirable) to plate (overcoat) the entire assembly, due (e.g.) to the presence of redundancy windows on the die). In order to effect such plating (a necessary step in transforming the free-standing wire stem 620 into a composite interconnection element), it is therefore important to mask the surface of the die prior to plating. This is illustrated in FIG. 6A by a masking material (such as photoresist) 630 which is selectively applied onto the face of the die 602 so as not to cover the face of the carrier substrate 610. Once masked in this manner, the assembly (i.e., of die 602, carrier substrate 610 and bond wire 618) can readily be overcoated with a material 622. The masking material 630 may be left in place, or may be removed after overcoating.

Figure 6B:
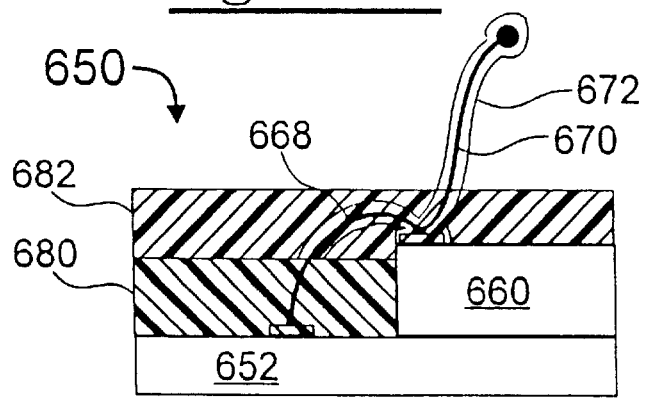
FIG. 6B is a side view of an alternate embodiment of the carrier assembly of FIG. 6, according to the invention.

FIG. 6B illustrates an alternate embodiment 650 of the carrier assembly of FIG. 6. In this embodiment:

(a) the masking material 680 (compare 630) is applied prior to overcoating (672, compare 622) the bond wire 668 (compare 618) and the wire stem 670 (compare 620); and (b) a layer of encapsulant 682 is applied over the masking material 680 to stabilize the bottom portion (base) of the resulting composite interconnection element (670/672, compare 620/622)—in other words, to "fix" the joint between the wire stem and the carrier 660 (compare 610). A suitable amount of encapsulant 682 is applied to cover the base of the composite interconnection (spring) element, while leaving the a substantial portion (including the tip) of the resulting composite interconnection (spring) element exposed. (Compare the technique described with respect to FIG. 5B.)

It is within the scope of this invention that one or both of these features ((a) and (b)) can be employed.

FIGS. 7A–7F illustrate an alternate technique 700 for fabricating and for employing the spring element carriers of the present invention.

Figure 7A:
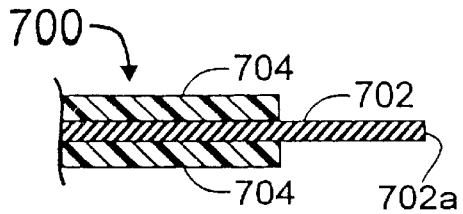
FIGS. 7A–7F are side views of an alternate embodiment of the carrier substrate of the present invention.

FIG. 7A illustrates a leadframe having a plurality (one of many shown) of leadframe fingers 702. Each finger 702 has an inner end 702a. Masking material 704, such as photoresist 704 is applied to the outer portions of both sides (top and bottom, as viewed) of the leadframe fingers 702, leaving inner portions of the leadframe fingers unmasked.

Figure 7B:
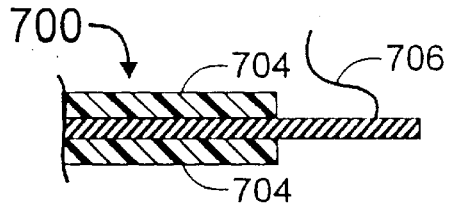
Figure 7C:
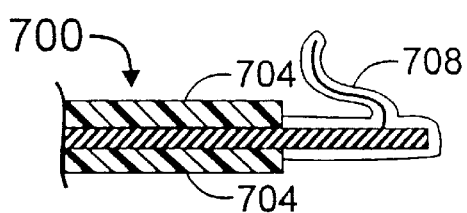

FIG. 7B illustrates that a core element (wire stem) 706 is bonded to the exposed inner portion of the leadframe finger 702, and is shaped to have a springable shape, in a manner akin to the above-described techniques of mounting wire stems to terminals of electronic components (compare core 216, FIG. 2A). Next, as illustrated in FIG. 7C, the leadframe with shaped core element mounted thereto is overcoated with a suitable conductive metallic material 708, such as nickel, in a manner such as is described hereinabove. In this manner, composite interconnection elements having a desired resiliency (and/or compliance) are formed as free-standing spring elements anchored to the inner ends of the leadframe fingers.

Figure 7D:
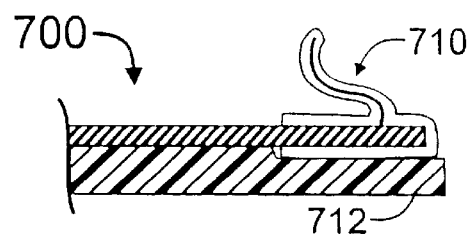

Next, as illustrated in FIG. 7D, the masking material 704 is removed, and a film 712 of an adhesive material such as adhesive tape or double-sided polyimide with adhesive is mounted to the underside (as viewed) of the leadframe fingers 702. The entire structure can then be encapsulated, such as with epoxy, which extends upward (as viewed) to the bases of the springs 710.

Figure 7E:
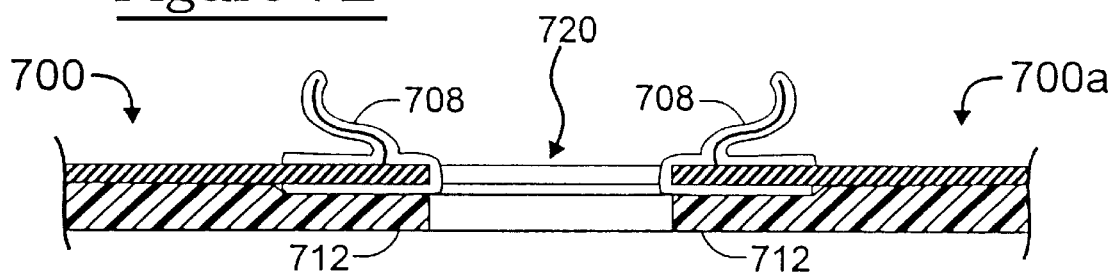

FIG. 7E illustrates a complete leadframe having two sets (700 and 700a) of leadframe fingers directed inward, towards one another, and a central opening 720 therebetween.

It is within the scope of this invention that the spring elements need not be composite interconnection elements (overcoated core), the same being merely exemplary, but rather could be monolithic springs (e.g., of a single, high yield strength material) which are inherently resilient.

As shown in FIG. 7E, the carrier is suitably mounted by the adhesive film 712 to a front surface of an electronic component 730 having a plurality of terminals 732, and each terminal is wire bonded to a respective one of the leadframe fingers 702 by a bond wire 734.

Figure 7F:
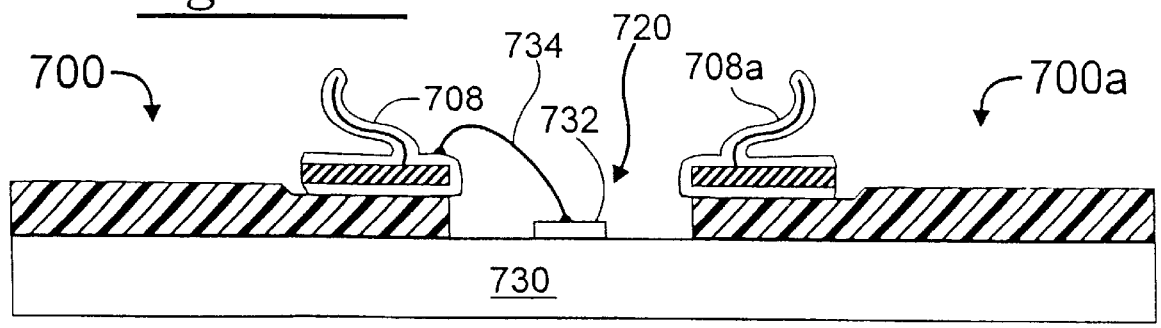

It is within the scope of this invention that the outer portions of the leadframe fingers 702—namely, those portions which were masked (704) and which did not become overcoated, can be etched away, or removed in any suitable manner. Preferably, however, the adhesive layer 712 covers the entire front (top, as viewed in FIG. 7E) surface of the electronic component (e.g., 730) to which the chip-scale carrier is mounted to protect the front surface of the electronic component. These two features are illustrated in FIG. 7F.

It is within the scope of this invention that the chip-scale carrier can be mounted to unsingulated semiconductor dies on a semiconductor wafer either before of after the semiconductor dies are tested and burned-in.

It is within the scope of this invention that the leadframe fingers (702) are initially tied to one another by a frame, similar to conventional leadframes, said frame being removed (such as by stamping away) after the chip-scale carrier is mounted to a semiconductor die. This has the advantage that standard leadframe processing equipment can be employed to handle the chip-scale carriers of the present invention. It is contemplated that the component (e.g., 730) would be picked and placed onto the leadframe, wire bonded (734) thereto, and encapsulated, prior to removing said leadframe frame (if any).

Chip-Scale Carrier

Figure 8A:
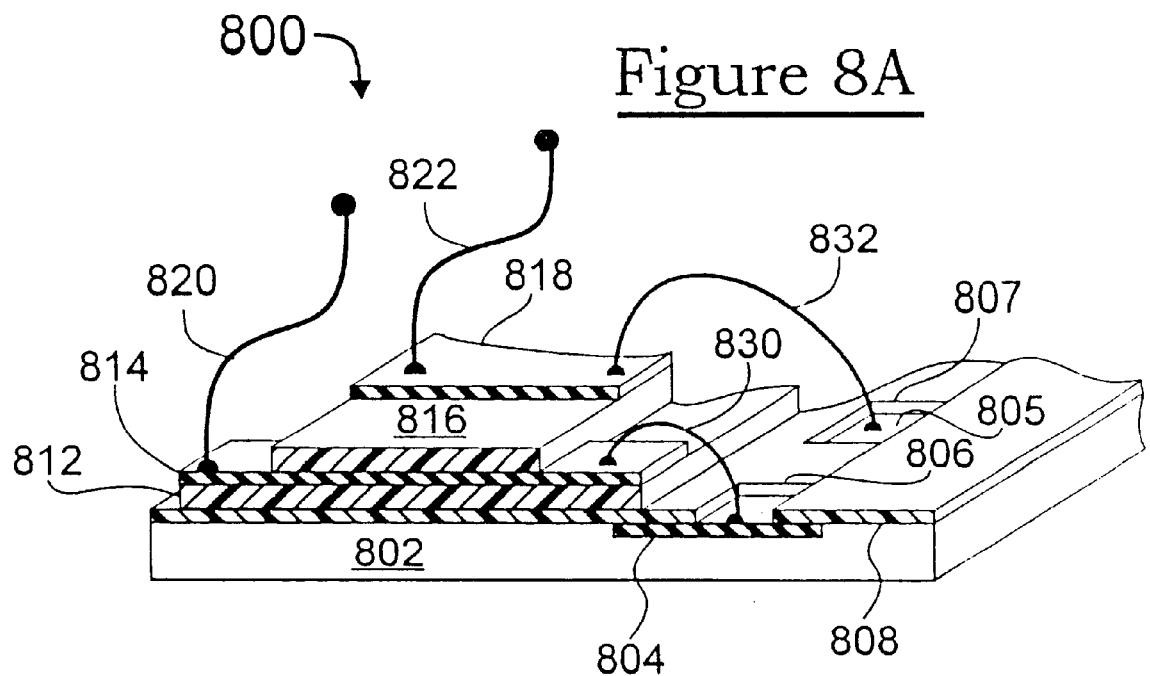
FIG. 8A is a perspective view of an alternate embodiment of the chip-scale carrier of the present invention.

FIG. 8A illustrates a chip-scale carrier 800 according to the invention. An electronic component 802 such as a semiconductor device has a plurality (two of many shown) of terminals 804 and 805 within openings 806 and 807, respectively, in an insulating layer 808 on the front (top, as viewed) surface of the component 802.

In a manner similar to the spring element carrier of FIGS. 5 and 5A, a substrate 810 (compare 510) is provided upon which spring elements (composite interconnection elements, resilient contact structures) are fabricated and from which bond wire connections to the terminals of the electronic component may be made. In this example, the substrate 810 is a multi-layer substrate, including an insulating layer 812, a patterned conductive layer 814 disposed atop the insulating layer 812, another insulating layer 816 disposed atop the conductive layer 814 and another patterned conductive layer 818 atop the insulating layer 816. The insulating layer 816 is disposed generally centrally upon the first conductive layer and is sized to permit two end portions of each of the individual conductive lines of the first conductive layer to be exposed, at corresponding two side edges of the second insulating layer.

It is within the scope of this invention that the alternating sequence of insulating and conductive layers can be repeated to form a multi-layer substrate having three or more layers.

The conductive layer 814 is patterned to have a plurality (one of many shown) of conductive lines extending from a one (left, as viewed) side edge of the insulating layer 812 to an opposite (right, as viewed) side edge of the insulating layer 814. Similarly, the conductive layer 818 is patterned to have a plurality (one of many shown) of conductive lines extending from a one (left, as viewed) side edge of the insulating layer 816 to an opposite (right, as viewed) side edge of the insulating layer 816. As illustrated, the insulating layer 812 is bigger than the insulating layer 816, and the insulating layer 816 is disposed atop a midportion of the conductive layer 814 so the ends of the conductive lines (814) are exposed.

A core element (wire stem) 820 is bonded to one exposed end (end portion) of the conductive line(s) 814, and a core element (wire stem) 822 is bonded to one exposed end (end portion) of the conductive line(s) 818, in the manner described hereinabove as a preliminary step in the fabrication of free-standing resilient contact structures extending from the conductive lines of the substrate.

The substrate 810 is disposed atop the insulating layer 808 of the electronic component (i.e., on the face of the electronic component). The inner ends (opposite end portions) of the conductive lines 814 and 818 are connected to selected ones of the terminals 804 and 805 of the electronic component 802 with bond wires 830 and 832, respectively.

As mentioned above, it is intended that the wire stems 820 and 822 be overcoated to impart a desired resiliency to a resulting composite interconnection element. To this end, prior to mounting the spring carrier to the electronic component, the "bonding shelves" (end portions of the conductive lines 814 and 818 which will be wire bonded to the terminals of the electronic component) may be masked with a masking material 824, the wire stems can be overcoated (e.g., plated) with one or more layers of conductive material 826, and the masking material 824 may then be removed, as illustrated by FIG. 8B.

An advantage of this embodiment (800) is that the wiring on each bonding shelf goes directly to the spring element (resilient contact structure), and there is no need for vias to be formed through the multi-layer substrate (810). This permits very high density connections to be made to the electronic component (802), without requiring fine conductive lines (on the substrate), which translates to reduced cost. Moreover, the chip-scale carrier of the present invention simplifies transitions from peripheral arrays of terminals on an electronic component to area arrays of spring elements.

Figure 8B:
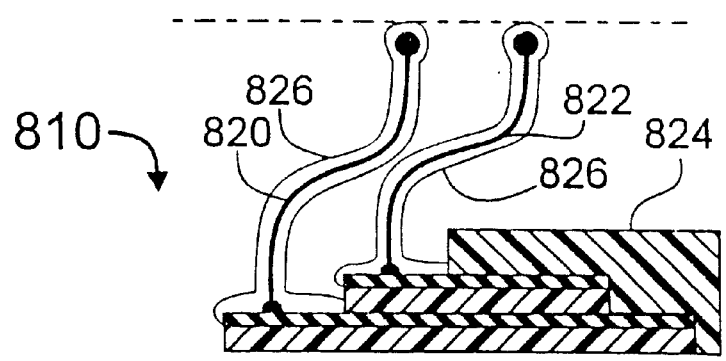
FIG. 8B is a side cross-sectional view of the chip-scale carrier of FIG. 8A.

As illustrated in FIG. 8B the spring elements (overcoated wire stems) can originate on any level, but can be caused to terminate in the same plane (as indicated by the dashed line in FIG. 8B). In other words, although the spring elements originate from different levels of the chip-scale carrier, they can readily be caused to terminate at the same height above the electronic component (802).

As mentioned above, the substrate (810) can have any number of layers. For example, a one layer can be dedicated to power, another dedicated to ground, and additional one or more layers dedicated to carrying signals to and from the electronic component.

The substrate (810) can be affixed to the electronic component in any suitable manner, such as with an adhesive, and is readily sized to sit atop a semiconductor device without overhanging the edges of the semiconductor device.

It is within the scope of this invention that any spring elements, including monolithic spring elements, may extend from the surfaces of the chip-scale carrier (e.g., 800). In other words, this invention is not limited to the use of composite spring elements comprising a core and an overcoat.

It is within the scope of this invention that a plurality of individual chip-scale carriers can be configured in an array for mounting, en masse, to an electronic component (e.g., a semiconductor wafer). For example, a plurality of chip-scale carriers can be "tied" together with bond wires which are overcoated to enhance their rigidity. Or, a plurality of chip-scale carriers can be physically associated with one another in a leadframe-type arrangement, or on a TAB (tape automated bonding) tape type carrier.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein. Several of these variations are set forth in the parent case.

For example, the technique 600 set forth in FIGS. 6 and 6A could be applied to a carrier substrate spanning two or more unsingulated dies on a wafer, in the manner set forth in FIG. 5A.

What is claimed is:

1. A method of mounting contact structures to semiconductor devices, comprising:

fabricating a plurality of free-standing contact structures on a surface of a carrier substrate;

disposing the carrier substrate on a surface of at least one semiconductor device; and connecting selected ones of the free-standing contact structures to selected ones of terminals of the at least one semiconductor device;

wherein:

selected ones of the free-standing contact structures comprise composite interconnection elements having a core comprising a first material overcoated with a second material which is harder than the first material.

2. The method according to claim 1, wherein:

the carrier substrate comprises an insulating substrate.

3. The method according to claim 1, wherein:

the bond wires are contiguous with the free-standing contact structures.

4. The method according to claim 1, wherein:

the carrier substrate comprises a leadframe.

5. The method according to claim 1, wherein:

the carrier substrate comprises a multi-layer substrate.

6. The method according to claim 1, wherein:

the carrier substrate is sized to sit atop a semiconductor device without overhanging edges of the semiconductor device.

7. The method according to claim 1, wherein:

each free-standing contact structure is independently compliant.

8. The method according to claim 1, wherein:

the carrier substrate is selected from the group consisting of ceramic, silicon, PCB material, and polymer, and a multi-layer substrate.

9. The method according to claim 1, wherein: the carrier substrate comprises a printed circuit board.

10. The method according to claim 1, wherein:

the carrier substrate comprises metal having an insulating coating.

11. The method according to claim 1, wherein:

the carrier substrate becomes more rigid when it is mounted to the surface of the at least one semiconductor device.

12. The method according to claim 1, further comprising:

mounting the carrier substrate to the semiconductor device with a material selected from the group consisting of thermoplastic, cyanide-ester, epoxy, silicone, and epoxy.

13. A method of mounting contact structures to semiconductor devices, comprising:

disposing a carrier substrate having a plurality of free-standing contact structures mounted to and extending from a surface thereof on a surface of at least one semiconductor device; and connecting the plurality of free-standing contact structures to a corresponding plurality of terminals on the at least one semiconductor device; wherein:

the carrier substrate is disposed on the at least one semiconductor device prior to the at least one semiconductor device being singulated from a semiconductor wafer.

14. The method, according to claim 13, wherein:

selected ones of the free-standing contact structures are connected to selected ones of the terminals of the at least one semiconductor device prior to the at least one semiconductor device being singulated from a semiconductor wafer.

15. The method, according to claim 13, further comprising:

encapsulating the bond wires and the surface of the at least one semiconductor die.

16. The method, according to claim 15, further comprising:

further encapsulating the carrier substrate and a base portion of the free-standing contact structures.

17. The method according to claim 1, wherein:

each free-standing contact structure is independently compliant.

18. The method, according to claim 13, wherein:

the carrier substrate comprises a material selected from the group consisting of metal having an insulating coating, ceramic, silicon, PCB material, and polymer.

* * * * *